US011764182B2

(12) United States Patent
Pak et al.

(10) Patent No.: US 11,764,182 B2
(45) Date of Patent: Sep. 19, 2023

(54) SEMICONDUCTOR PACKAGE AND SEMICONDUCTOR DEVICE INCLUDING THE SAME

(71) Applicant: Samsung Electronics Co., Ltd., Suwon-si (KR)

(72) Inventors: Jun So Pak, Seongnam-si (KR); Junghwa Kim, Seoul (KR); Heeseok Lee, Suwon-si (KR); Moonseob Jeong, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 114 days.

(21) Appl. No.: 17/230,192

(22) Filed: Apr. 14, 2021

(65) Prior Publication Data
US 2022/0068870 A1    Mar. 3, 2022

(30) Foreign Application Priority Data

Sep. 1, 2020 (KR) .................. 10-2020-0111280

(51) Int. Cl.
*H01L 23/498* (2006.01)
*H01L 23/00* (2006.01)

(52) U.S. Cl.
CPC ........ *H01L 24/24* (2013.01); *H01L 23/49811* (2013.01); *H01L 24/20* (2013.01);
(Continued)

(58) Field of Classification Search
CPC ... H01L 24/24; H01L 23/49811; H01L 24/20; H01L 23/49822; H01L 23/49833; H01L 23/49838
See application file for complete search history.

(56) References Cited

U.S. PATENT DOCUMENTS 8,071,470 B2    12/2011  Khor et al.
8,575,018 B2    11/2013  Lin et al.
(Continued)

FOREIGN PATENT DOCUMENTS

| CN | 103151329 A | * | 6/2013 | ....... H01L 21/76885 |
| KR | 2002-0091470 A | | 12/2002 | |

*Primary Examiner* — Selim U Ahmed
*Assistant Examiner* — Evan G Clinton
(74) *Attorney, Agent, or Firm* — Harness, Dickey & Pierce, P.L.C.

(57) ABSTRACT

A semiconductor package may include a semiconductor chip including a chip pad, a redistribution structure including a redistribution insulation layer on the semiconductor chip and first redistribution patterns on a surface of the redistribution insulation layer, a passivation layer covering the first redistribution patterns, an UBM pattern on the passivation layer and extending into an opening of the passivation layer, a second redistribution pattern on the UBM pattern, conductive pillars on the second redistribution pattern, and a package connection terminal on the conductive pillars. The opening in the passivation layer may vertically overlap a portion of each of the first redistribution patterns. The second redistribution pattern may connect some of the first redistribution patterns to each other. Some of the conductive pillars may be connected to one another through the second redistribution pattern. The first redistribution patterns may be connected to the chip pad.

20 Claims, 18 Drawing Sheets

(52) U.S. Cl.
CPC ............... *H01L 2224/2101* (2013.01); *H01L 2224/214* (2013.01); *H01L 2224/215* (2013.01); *H01L 2224/24225* (2013.01); *H01L 2924/01022* (2013.01); *H01L 2924/01029* (2013.01)

(56) References Cited

U.S. PATENT DOCUMENTS

| | | |
|---|---|---|
| 9,006,097 B2 | 4/2015 | Lu et al. |
| 9,960,137 B1 | 5/2018 | Huang et al. |
| 10,249,586 B2 | 4/2019 | Arvin et al. |
| 10,515,828 B2 | 12/2019 | Lin et al. |
| 2006/0220167 A1* | 10/2006 | Min .................. H01L 21/4857 156/60 |
| 2017/0092510 A1* | 3/2017 | Oh ..................... H01L 21/4842 |
| 2017/0170155 A1* | 6/2017 | Yu ......................... H01L 25/50 |
| 2019/0057934 A1* | 2/2019 | Lin ......................... H01L 24/19 |
| 2022/0052008 A1* | 2/2022 | Fan ...................... H01L 21/768 |

* cited by examiner

SEMICONDUCTOR PACKAGE AND SEMICONDUCTOR DEVICE INCLUDING THE SAME

CROSS-REFERENCE TO RELATED APPLICATION

This application is based on and claims priority under 35 U.S.C. § 119 to Korean Patent Application No. 10-2020-0111280, filed on Sep. 1, 2020 in the Korean Intellectual Property Office, the disclosure of which is incorporated by reference herein in its entirety.

BACKGROUND

Inventive concept relate to a semiconductor package and/or a semiconductor device having a structure where the semiconductor package is mounted on a package substrate.

Semiconductor packages may include a semiconductor chip and a redistribution structure including a plurality of redistribution patterns connected to the semiconductor chip. As a storage capacity of the semiconductor chip increases, semiconductor packages may be developed to be thin and lightweight. Therefore, a pattern shape of each of the plurality of redistribution patterns included in the redistribution structure may become progressively complicated, and the number of layers, where the plurality of redistribution patterns are formed in a horizontal direction, may be progressively reduced.

SUMMARY

Inventive concepts provide a semiconductor package, which is thin and lightweight, and/or a semiconductor device including the semiconductor package.

Inventive concepts provide a semiconductor package having a reduced inductance and improved power integrity and/or a semiconductor device including the semiconductor package.

According to an embodiment of inventive concepts, a semiconductor package may include a semiconductor chip including a chip pad, a redistribution structure including a redistribution insulation layer on the semiconductor chip and a plurality of first redistribution patterns on a surface of the redistribution insulation layer, a passivation layer covering the plurality of first redistribution patterns, an under-bump metal (UBM) pattern on the passivation layer and extending into the opening of the passivation layer, a second redistribution pattern on the UBM pattern, a plurality of conductive pillars on the second redistribution pattern, and a package connection terminal on the plurality of conductive pillars. The plurality of first redistribution patterns may be connected to the chip pad. The passivation layer may be on the redistribution structure and may include an opening vertically overlapping a portion of each of the plurality of first redistribution patterns. The second redistribution pattern may connect some of the plurality of first redistribution patterns to each other. Some of the plurality of conductive pillars may be connected to one another through the second redistribution pattern.

According to an embodiment of inventive concepts, a semiconductor package may include a semiconductor chip including a chip pad, a redistribution structure including a redistribution insulation layer on the semiconductor chip and a plurality of first redistribution patterns on a surface of the redistribution insulation layer, a passivation layer covering the plurality of first redistribution patterns, an under-bump metal (UBM) pattern on the passivation layer and extending into the opening of the passivation layer, and a plurality of conductive pillars on the UBM pattern. The plurality of first redistribution patterns may be connected to the chip pad. The passivation layer may be on the redistribution structure and may include an opening vertically overlapping a portion of each of the plurality of first redistribution patterns. The UBM pattern may connect some of the plurality of first redistribution patterns to each other. Some of the plurality of conductive pillars may be connected to one another through the UBM pattern.

According to an embodiment of inventive concepts, a semiconductor device may include a package substrate, a semiconductor package mounted on the package substrate, a redistribution structure, a passivation layer, an under-bump metal (UBM) pattern, a plurality of conductive pillars on the UBM pattern, and a plurality of package connection terminals on the plurality of conductive pillars. The package substrate may include a package substrate pattern, a package substrate insulation layer surrounding the package substrate pattern, and a package substrate pad on the package substrate insulation layer. The package substrate pad may be connected to the package substrate pattern. The semiconductor package may include a semiconductor chip including a chip pad. The redistribution structure may include a redistribution insulation layer on the semiconductor chip and a plurality of first redistribution patterns on a surface of the redistribution insulation layer. The plurality of first redistribution patterns may be connected to the chip pad. The passivation layer may cover the plurality of first redistribution patterns, may be on the redistribution structure, and may include an opening vertically overlapping a portion of each of the plurality of first redistribution patterns. The UBM pattern may be on the passivation layer and may extend into the opening of the passivation layer. The UBM pattern may connect some of the plurality of first redistribution patterns to each other. Some of the plurality of conductive pillars may be connected to one another through the UBM pattern. The plurality of package connection terminals may contact the package substrate pad of the package substrate.

According to an aspect of inventive concepts, a semiconductor package and a semiconductor device including the same may be provided, which may include an UBM pattern and a second redistribution pattern, which may be on a redistribution structure including a plurality of first redistribution patterns and connect some of the first redistribution patterns. Therefore, a thickness of a redistribution structure of a semiconductor package may decrease, and the semiconductor package may be thin and lightweight. Also, in a case where a semiconductor package is mounted on a package substrate and operates, an inductance of the semiconductor package may decrease, and power integrity thereof may be improved.

BRIEF DESCRIPTION OF THE DRAWINGS

Embodiments of inventive concepts will be more clearly understood from the following detailed description taken in conjunction with the accompanying drawings in which.

DETAILED DESCRIPTION OF THE EMBODIMENTS

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

Hereinafter, embodiments will be described in detail with reference to the accompanying drawings.

Figure 1:
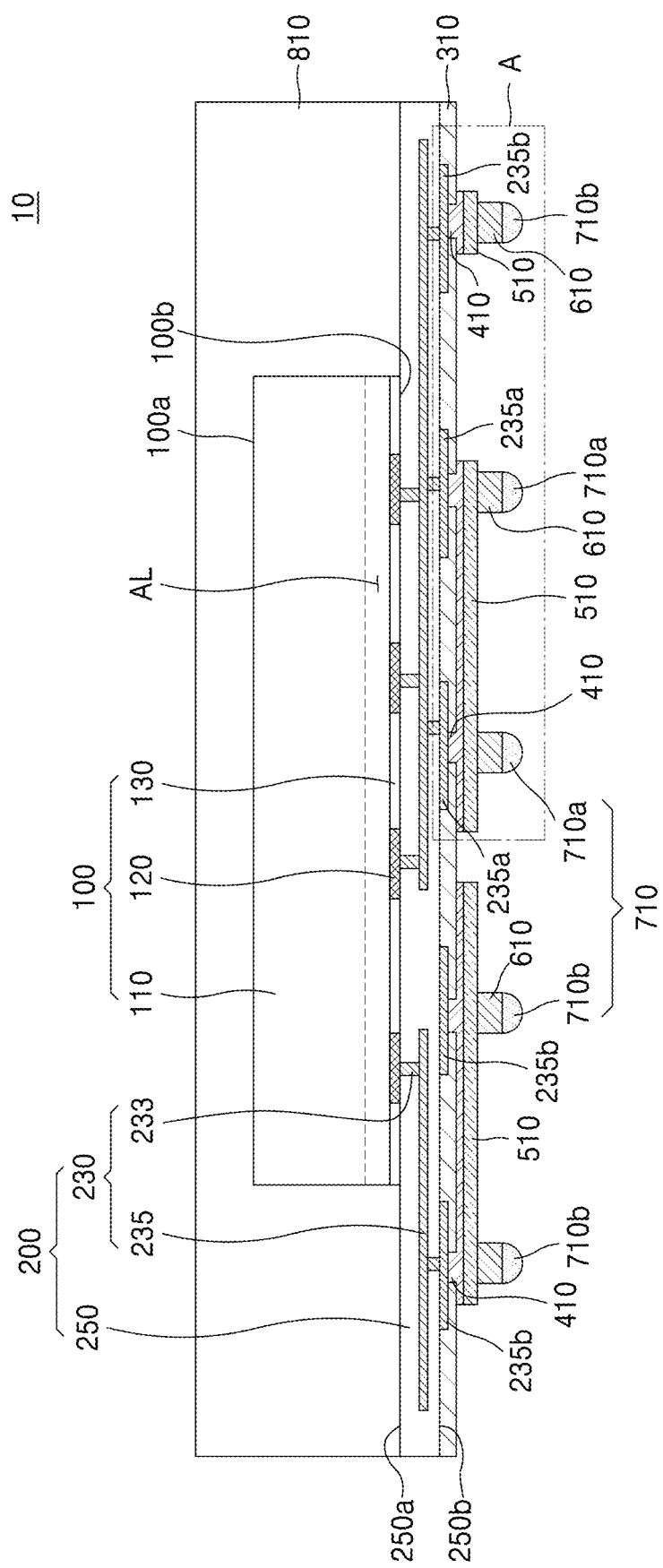
FIG. 1 is a cross-sectional view of a semiconductor package according to an embodiment.
Figure 2:
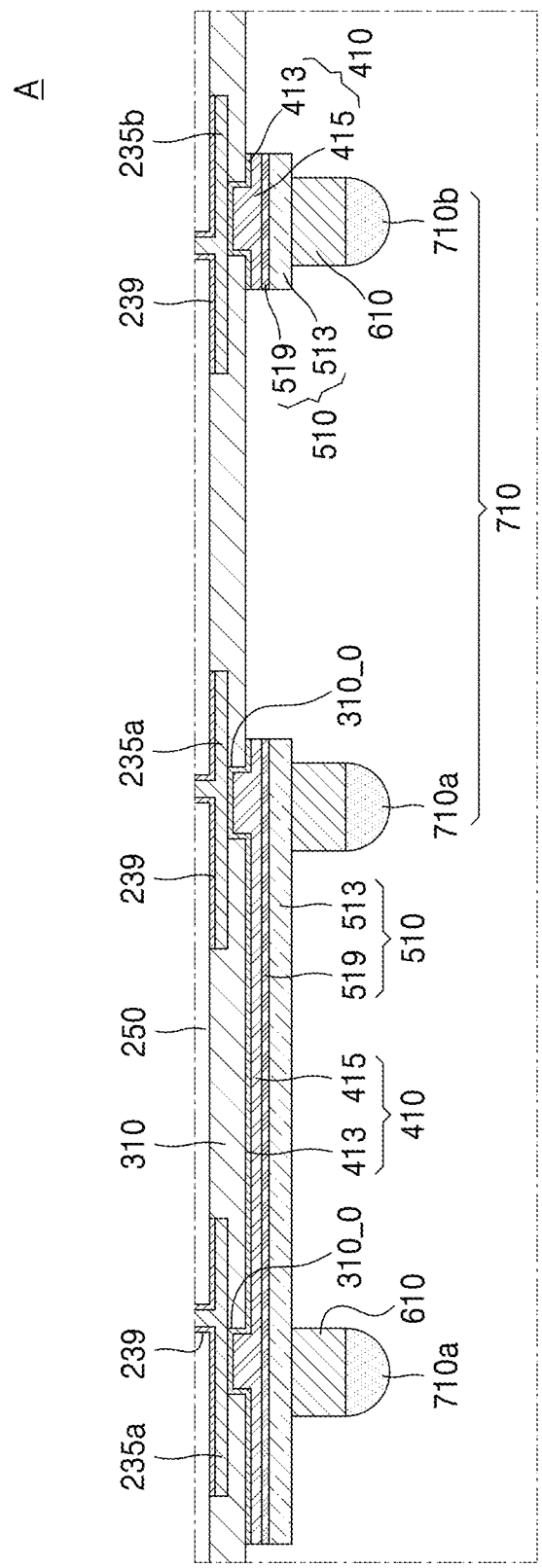
FIG. 2 is an enlarged view of a region A of FIG. 1.

FIG. 1 is a cross-sectional view of a semiconductor package 10 according to an embodiment. FIG. 2 is an enlarged view of a region A of FIG. 1.

The semiconductor package 10 according to an embodiment may include a semiconductor chip 100, a redistribution structure 200 including a first redistribution pattern 230 and a redistribution insulation layer 250, a passivation layer 310, an under-bump metal (UBM) pattern 410, a second redistribution pattern 510, a conductive pillar 610, a package connection terminal 710, and a molding layer 810.

The semiconductor chip 100 may include a semiconductor substrate 110, a chip pad 120, and an insulation barrier layer 130. Also, the semiconductor chip 100 may include a top surface 100a and a bottom surface 100b. The bottom surface 100b of the semiconductor chip 100 may include one surface of the semiconductor chip 100 adjacent to the chip pad 120, and the top surface 100a of the semiconductor chip 100 may include one surface of the semiconductor chip 100 opposite to the bottom surface 100b of the semiconductor chip 100.

In an embodiment, the semiconductor chip 100 may include a logic semiconductor chip. The logic semiconductor chip may include, for example, a logic semiconductor chip such as a central processing unit (CPU), a micro processing unit (MPU), a graphics processing unit (GPU), an application processor (AP).

Also, the semiconductor chip 100 may include a memory semiconductor chip. The memory semiconductor chip, for example, may include a volatile memory semiconductor chip such as dynamic random access memory (DRAM) or static random access memory (SRAM), or may include a volatile memory semiconductor chip such as phase-change random access memory (PRAM), magneto-resistive random access memory (MRAM), ferroelectric random access memory (FeRAM), or resistive random access memory (RRAM).

In FIG. 1, the semiconductor package 10 is illustrated as including one semiconductor chip 100, but is not limited thereto and may include two or more semiconductor chips.

For example, the semiconductor package 10 may include a plurality of semiconductor chips, and moreover, may include a system in package (SIP) where a plurality of different kinds of semiconductor chips are electrically connected to one another and operate as one system.

The semiconductor substrate 110 of the semiconductor chip 100 may include silicon (Si). Also, semiconductor substrate 110 may include a semiconductor element, such as germanium (Ge), or a compound semiconductor such as silicon carbide (SiC), gallium arsenide (GaAs), indium arsenide (InAs), and indium phosphide (InP). However, a material of the semiconductor substrate 110 is not limited to the above description.

In an embodiment, the semiconductor substrate 110 may include an active layer AL in a region thereof adjacent to the bottom surface 100b of the semiconductor chip 100. That is, the active layer AL of the semiconductor chip 100 may be formed at a portion of the semiconductor substrate 110 adjacent to the redistribution structure 200.

In an embodiment, the active layer AL may include a plurality of various kinds of individual devices. For example, the plurality of individual devices may include various microelectronic devices (for example, a micro-electro-mechanical system (MEMS), active devices, passive devices, and an image sensor such as a complementary metal-oxide semiconductor (CMOS) transistor, a metal-oxide-semiconductor filed effect transistor (MOSFET), system large scale integration (LSI), and a CMOS imaging sensor (CIS).

The chip pad 120 of the semiconductor chip 100 may be on one surface of the semiconductor substrate 110 and may include a pad which is electrically connected to the plurality of individual devices in the active layer AL. Also, the chip pad 120 of the semiconductor chip 100 may be provided in plurality.

In an embodiment, one surface of the chip pad 120 may contact the semiconductor substrate 110, and another surface, which is opposite to the one surface, of the chip pad 120 may contact the redistribution structure 200. A thickness of the chip pad 120 may be about 0.5 μm to about 3 μm. However, a thickness of the chip pad 120 is not limited thereto.

In an embodiment, a material of the chip pad 120 may include aluminum (Al). However, inventive concepts are not limited to the above description, and the material of the chip pad 120 may include metal, such as nickel (Ni), copper (Cu), gold (Au), silver (Ag), tungsten (W), titanium (Ti), tantalum (Ta), indium (In), molybdenum (Mo), cobalt (Co), tin (Sn), magnesium (Mg), rhenium (Re), beryllium (Be), gallium (Ga), or ruthenium (Ru), or an alloy thereof.

The insulation barrier layer 130 of the semiconductor chip 100 may be on one surface of the semiconductor substrate 110 and may surround a side surface of the chip pad 120. Also, the insulation barrier layer 130 may expose a surface, connected to the redistribution structure 200, of surfaces of the chip pad 120 of the semiconductor chip 100. For example, the insulation barrier layer 120 may have a thickness of about 0.3 µm to about 2.5 µm and may cover a side surface of the chip pad 120. However, a thickness of the insulation barrier layer 130 is not limited thereto.

In an embodiment, a material of the insulation barrier layer 130 may include silicon nitride (SiN). However, inventive concepts are not limited thereto, and the insulation barrier layer 130 may include silicon oxynitride (SiON), silicon oxide (SiO$_2$), silicon oxide carbon nitride (SiOCN), and silicon carbon nitride (SiCN), or a combination thereof.

The redistribution structure 200 may be on the bottom surface 100b of the semiconductor chip 100 and may include a structure for electrically connecting the package connection terminal 710 to the plurality of individual devices included in the semiconductor chip 100.

In an embodiment, the redistribution structure 200 may include the redistribution insulation layer 250 and the redistribution pattern 230 which extends in the redistribution insulation layer 250 or is disposed on a bottom surface 250b of the redistribution insulation layer 250.

The redistribution insulation layer 250 may include a top surface 250a and the bottom surface 250b. The top surface 250a of the redistribution insulation layer 250 may include one surface of the redistribution insulation layer 250 contacting the semiconductor chip 100, and the bottom surface 250b of the redistribution insulation layer 250 may include one surface of the redistribution insulation layer 250, which is opposite to the top surface 250a of the redistribution insulation layer 250 and contacts the passivation layer 310.

In an embodiment, the redistribution insulation layer 250 may include an insulating material of a photo imageable dielectric enabling a photolithography process to be performed thereon. For example, the redistribution insulation layer 250 may include a photosensitive polyimide (PSPI).

However, inventive concepts are not limited thereto, and the redistribution insulation layer 250 may include oxide or nitride. For example, the redistribution insulation layer 250 may include silicon oxide or silicon nitride.

The first redistribution pattern 230 may include a conductive pattern electrically connected to the chip pad 120. For example, the first redistribution pattern 230 may include a first redistribution via pattern 233, extending in a vertical direction in the redistribution insulation layer 250, or a first redistribution line pattern 235 which extends in the vertical direction in the redistribution insulation layer 250 or extends in a horizontal direction on a surface of the redistribution insulation layer 250.

In an embodiment, the first redistribution line pattern 235 may include a plurality of layers, and adjacent redistribution line patterns 235 may be electrically connected to each other through the first redistribution via pattern 233.

For example, a portion of the first redistribution line pattern 235 may be disposed to extend in the horizontal direction in the redistribution insulation layer 250. Also, portions 235a and 235b of the first redistribution line pattern 235 may be disposed to extend in a horizontal direction on the bottom surface 250b of the redistribution insulation layer 250.

In an embodiment, a portion of the first redistribution line pattern 235 disposed on the bottom surface 250b of the redistribution insulation layer 250 may include a first signal redistribution line pattern 235a configured to transfer a data signal and/or a control signal between the semiconductor chip 100 and the package connection terminal 710.

Also, a portion of the first redistribution line pattern 235 disposed on the bottom surface 250b of the redistribution insulation layer 250 may include a first power/ground redistribution line pattern 235b configured to supply power to the semiconductor chip 100 or to ground the semiconductor chip 100.

In an embodiment, a portion of the first redistribution via pattern 233 may connect the chip pad 120 of the semiconductor chip 100 to the first redistribution line pattern 235. Also, a portion of the first redistribution via pattern 233 may connect a plurality of first redistribution line patterns 235 to each other.

In an embodiment, a material of the first redistribution pattern 230 may include Cu. However, inventive concepts are not limited thereto, and the material of the first redistribution pattern 230 may include metal, such as nickel (Ni), copper (Cu), gold (Au), silver (Ag), tungsten (W), titanium (Ti), tantalum (Ta), indium (In), molybdenum (Mo), cobalt (Co), tin (Sn), magnesium (Mg), rhenium (Re), beryllium (Be), gallium (Ga), or ruthenium (Ru), or an alloy thereof.

In an embodiment, the first redistribution pattern 230 may further include a first redistribution seed layer 239, which is disposed between the first redistribution via pattern 233 and the first redistribution insulation layer 250 and is disposed between the first redistribution line 235 and the redistribution insulation layer 250.

In an embodiment, the first redistribution seed layer 239 may be formed by performing a physical vapor deposition (PVD) process, and the first redistribution via pattern 233 and the first redistribution line pattern 235 may be formed by performing a plating process using the first redistribution seed layer 239.

In an embodiment, a material of the first redistribution seed layer 239 may include Ti, titanium tungsten (TiW), titanium nitride (TiN), Ta, tantalum nitride (TaN), chromium (Cr), and Al, or a combination thereof.

For example, a structure of the first redistribution pattern 230 may include Cu/Ti, where Cu is stacked on Ti, or Cu/TiW, where Cu is stacked on TiW. Also, in a case where Cu is used as the first redistribution via pattern 233 and the first redistribution line pattern 235, at least portions of the first redistribution seed layer 239 may act as a diffusive barrier layer.

The passivation layer 310 may include a layer which is conformally formed along a bottom surface 200b of the redistribution structure 200 and a surface of the first redistribution line pattern 235. Also, the passivation layer 310 may cover the first redistribution line pattern 235, on the bottom surface 200b of the redistribution structure 200.

In more detail, the passivation layer 310 may cover the first redistribution line pattern 235 which extends in a horizontal direction on the bottom surface 200b of the redistribution structure 200. For example, the passivation layer 310 may cover the first signal redistribution line pattern 235a and the first power/ground redistribution line pattern 235b, which are disposed on the bottom surface 250b of the redistribution insulation layer 250.

In an embodiment, the passivation layer 310 may include an opening 3100 which exposes a portion of the redistribution line pattern 235. In other words, the passivation layer 310 may include the opening 310_O which vertically overlaps a portion of the redistribution line pattern 235. For example, the passivation layer 310 may include a plurality of openings 310_O which expose a portion of the first signal redistribution line pattern 235a and a portion of the first power/ground redistribution line pattern 235b.

In an embodiment, the plurality of openings 310_O of the passivation layer 310 may be filled by the UBM pattern 410 to be described below. Therefore, the passivation layer 310 may surround at least a portion of a side surface of the UBM pattern 410.

In an embodiment, a material of the passivation layer 310 may include SiN, SiON, SiO$_2$, SiOCN, and SiCN, or a combination thereof.

The UBM pattern 410 may include a conductive material pattern which is filled into the plurality of openings 310_O of the passivation layer 310 and is disposed on a surface of the passivation layer 310.

In an embodiment, the UBM pattern 410 may include a conductive material pattern which connects some of the plurality of redistribution line patterns 235 disposed in a horizontal direction on the bottom surface 200b of the redistribution structure 200. For example, the UBM pattern 410 may be formed through a general photolithography process and an etching process.

For example, the UBM pattern 410 may connect a plurality of first signal redistribution line patterns 235a disposed on the bottom surface 250b of the redistribution insulation layer 250. That is, the UBM pattern 410 may include a pattern which connects a plurality of first signal redistribution line patterns 235a, for transferring a data signal and/or a control signal of the semiconductor chip 100 to the package connection terminal 710.

Also, the UBM pattern 410 may connect a plurality of first power/ground redistribution line patterns 235b disposed on the bottom surface 250b of the redistribution insulation layer 250. That is, the UBM pattern 410 may include a pattern which connects the first power/ground redistribution line patterns 235b, for the supplying and grounding of power of the semiconductor chip 100.

However, inventive concepts are not limited thereto, and the UBM pattern 410 may connect a first signal redistribution line pattern 235a and a first power/ground redistribution line pattern 235b, which are disposed on the bottom surface 250b of the redistribution insulation layer 250.

The UBM pattern 410 may include a UBM seed layer 413 and a UBM conductive layer 415 on the UBM seed layer 413.

In an embodiment, the UBM seed layer 413 may include a seed layer which is conformally formed along a surface of the passivation layer 310 and a surface of the redistribution line pattern 235 exposed by the opening 310_O of the passivation layer 310.

In an embodiment, the UBM seed layer 413 may be formed by performing a PVD process. In an embodiment, a material of the UBM seed layer 413 may include Ti, TiW, TiN, Ta, TaN, Cr, and Al, or a combination thereof.

In an embodiment, the UBM conductive layer 415 may include a conductive material layer having a pattern, which is on the UBM seed layer 413 and connects some of a plurality of first redistribution patterns 230. Also, the UBM conductive layer 415 may be disposed between the UBM seed layer 413 and the second redistribution pattern 510.

In an embodiment, a material of the UBM conductive layer 415 may include Cu. However, inventive concepts are not limited thereto, and the material of the UBM conductive layer 415 may include metal, such as nickel (Ni), copper (Cu), gold (Au), silver (Ag), tungsten (W), titanium (Ti), tantalum (Ta), indium (In), molybdenum (Mo), cobalt (Co), tin (Sn), magnesium (Mg), rhenium (Re), beryllium (Be), gallium (Ga), or ruthenium (Ru), or an alloy thereof.

For example, a structure of the UBM pattern 410 may include Cu/Ti, where Cu is stacked on Ti, or Cu/TiW, where Cu is stacked on TiW. Also, in a case where Cu is used as the UBM conductive layer 415, at least portions of the UBM seed layer 413 may act as a diffusive barrier layer.

In an embodiment, a thickness of the UBM seed layer 413 may be about 0.05 μm to about 0.20 μm. For example, a thickness of the UBM seed layer 413 may be about 0.1 μm. Also, a thickness of the UBM conductive layer 415 may be about 0.20 μm to about 0.50 μm. For example, a thickness of the UBM conductive layer 415 may be about 0.3 μm.

The second redistribution pattern 510 may include a pattern which is disposed on the UBM pattern 410 and connects at least some of the plurality of first redistribution patterns 230 disposed on the bottom surface 250b of the redistribution insulation layer 250.

In an embodiment, the second redistribution pattern 510 may connect at least some of the plurality of first redistribution patterns 230 disposed on the bottom surface 250b of the redistribution insulation layer 250 along with the UBM pattern 410.

In an embodiment, the second redistribution pattern 510 may be on the UBM pattern 410 to vertically overlap the UBM pattern 410. Also, a side surface of the second redistribution pattern 510 may be on the same plane as a side surface of the UBM pattern 410. Therefore, when the semiconductor package 10 is seen in terms of a plane, a shape of the second redistribution pattern 510 may be substantially the same as a shape of the UBM pattern 410.

In other words, the second redistribution pattern 510 may connect the plurality of redistribution line patterns 235 disposed on the bottom surface 250b of the redistribution insulation layer 250 along with the UBM pattern 410. For example, the second redistribution pattern 510 may connect the first signal redistribution line patterns 235a along with the UBM pattern 410, or may connect the first power/ground redistribution line patterns 235b. Also, the second redistribution pattern 510 may connect the first signal redistribution line pattern 235a to the first power/ground redistribution line pattern 235b along with the UBM pattern 410.

Also, the second redistribution pattern 510 may have a thickness of about 3 μm to about 10 μm on the UBM pattern 410. For example, the second redistribution pattern 510 may have a thickness of about 5 μm on the UBM pattern 410.

In an embodiment, the second redistribution pattern 510 may be exposed to the outside of the semiconductor package 10. For example, the second redistribution pattern 510 may protrude from one surface of the passivation layer 310 and may be observed at a region under the semiconductor package 10. Therefore, the second redistribution pattern 510 may configure a portion of an external appearance of the semiconductor package 10.

The second redistribution pattern 510 may include a second redistribution line pattern 513 and a second redistribution seed layer 519. In an embodiment, the second redistribution line pattern 513 may include a single-layer pattern which extends in a horizontal direction on the UBM pattern 410.

In an embodiment, a material of the second redistribution line pattern 513 may include Cu. However, inventive concepts are not limited thereto, and the material of the second redistribution line pattern 513 may include metal, such as nickel (Ni), copper (Cu), gold (Au), silver (Ag), tungsten (W), titanium (Ti), tantalum (Ta), indium (In), molybdenum (Mo), cobalt (Co), tin (Sn), magnesium (Mg), rhenium (Re), beryllium (Be), gallium (Ga), or ruthenium (Ru), or an alloy thereof.

In an embodiment, the second redistribution seed layer 519 may include a layer disposed between the second redistribution line pattern 513 and the UBM pattern 410. The second redistribution seed layer 519 may be formed by performing a PVD process. Also, the second redistribution line pattern 513 may be formed by performing a plating process using the second redistribution seed layer 519.

In an embodiment, a material of the second redistribution seed layer 519 may include Ti, TiW, TiN, Ta, TaN, Cr, and Al, or a combination thereof.

For example, a structure of the second redistribution pattern 510 may include Cu/Ti, where Cu is stacked on Ti, or Cu/TiW, where Cu is stacked on TiW. Also, in a case where Cu is used as a material of the second redistribution line pattern 513, at least portions of the second redistribution seed layer 519 may act as a diffusive barrier layer.

The conductive pillar 610 may include a conducive material pillar which extends in a vertical direction on the second redistribution pattern 510. Also, the conductive pillar 610 may be configured to electrically connect the package connection terminal 710 to the second redistribution pattern 510.

In an embodiment, the conductive pillar 610 may have a circular pillar shape or a polygonal pillar shape. For example, the conductive pillar 610 may have at least one shape of a triangular pillar, a tetragonal pillar, a pentagonal pillar, a hexagonal pillar, and an octagonal pillar.

In an embodiment, a material of the conductive pillar 610 may include Cu. However, inventive concepts are not limited thereto, and the material of the conductive pillar 610 may include metal, such as nickel (Ni), copper (Cu), gold (Au), silver (Ag), tungsten (W), titanium (Ti), tantalum (Ta), indium (In), molybdenum (Mo), cobalt (Co), tin (Sn), magnesium (Mg), rhenium (Re), beryllium (Be), gallium (Ga), or ruthenium (Ru), or an alloy thereof.

Also, when the semiconductor package 10 is seen in terms of a plane, a width of the conductive pillar 610 (e.g., a horizontal-direction length of the conductive pillar 610) may be less than that of the second redistribution pattern 510. For example, a width of a surface, contacting the second redistribution pattern 510, of surfaces of the conductive pillar 610 may be less than that of the second redistribution pattern 510.

In an embodiment, the conductive pillar 610 may have a thickness of about 5 μm to about 20 μm (e.g., the horizontal-direction length of the conductive pillar 610). For example, the conductive pillar 610 may have a thickness of about 10 μm.

Figure 8:
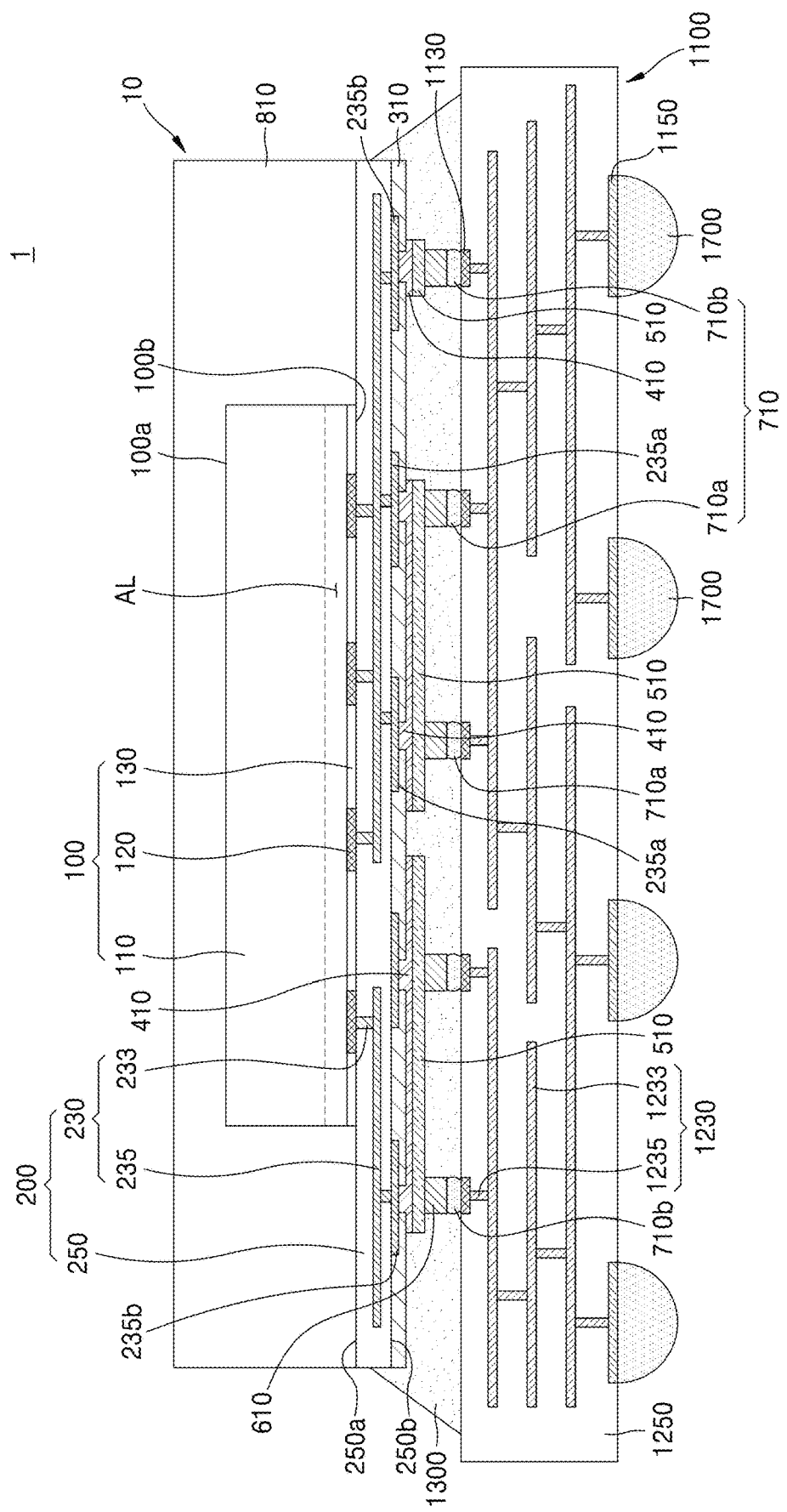
FIG. 8 is a cross-sectional view of a semiconductor device according to an embodiment.

The package connection terminal 710 may include a connection terminal for electrically connecting the semiconductor chip 100 to a package substrate (1100 of FIG. 8). The package connection terminal 710 may be attached on one surface of the conductive pillar 610.

In an embodiment, the package connection terminal 710 may include a solder ball including a metal material, which includes at least one material of Sn, Ag, Cu, and Al.

In an embodiment, the package connection terminal 710 may be provided in plurality. Also, some of the plurality of package connection terminals 710 may be electrically connected to one another through the UBM pattern 410 and the second redistribution pattern 510. Also, the number of package connection terminals 710 may be less than the number of external connection terminals (1700 of FIG. 8) attached on the package substrate 1100.

For example, package connection terminals 710a, having a function of transferring the data signal and/or the control signal, of the plurality of package connection terminals 710 may be electrically connected to one another through the UBM pattern 410 and the second redistribution pattern 510.

Also, package connection terminals 710b, having a function of grounding or supplying power, of the plurality of package connection terminals 710 may be electrically connected to one another through the UBM pattern 410 and the second redistribution pattern 510.

Also, the package connection terminals 710a having a function of transferring the data signal and/or the control signal and the package connection terminals 710b having a function of grounding or supplying power among the plurality of package connection terminals 710 may be electrically connected to one another through the UBM pattern 410 and the second redistribution pattern 510.

In an embodiment, a thickness of the package connection terminal 710 may be about 15 μm to about 30 μm. For example, a thickness of the package connection terminal 710 may be about 23 μm.

In an embodiment, at least one of the plurality of connection terminals 710 may be disposed outward from a side surface of the semiconductor chip 100. Therefore, the semiconductor package 10 may include a semiconductor package having a fan-out structure. For example, the semiconductor package 10 may include a fan-out wafer level package (FO-WLP) or a fan-out panel level package (FO-PLP).

The molding layer 810 may include a layer which surrounds the semiconductor chip 100, on a top surface 200a of the redistribution structure 200. Also, the molding layer 810 may include a layer which fixes the semiconductor chip 100 to the redistribution structure 200.

In an embodiment, the molding layer 810 may form an external appearance of the semiconductor package 10 along with the redistribution structure 200. For example, a side surface of the molding layer 810 and a side surface of the redistribution structure 200 may configure a side surface of the semiconductor package 10. Also, a top surface of the molding layer 810 may configure a top surface of the semiconductor package 10. The side surface of the molding layer 810 may be on the same plane as the side surface of the redistribution structure 200.

In an embodiment, the molding layer 810 may surround the top surface 100a and the side surface of the semiconductor chip 100, on the redistribution structure 200. However, unlike the illustration of FIG. 1, the molding layer 810 may surround only the side surface of the semiconductor chip 100, on the redistribution structure 200, and may not surround the top surface 100a of the semiconductor chip 100. For example, one surface of the molding layer 810 may be on the same plane as the top surface 100a of the semiconductor chip 100, and the top surface 100a of the semiconductor chip 100 may be exposed to the outside.

In an embodiment, the molding layer 810 may include an epoxy molding compound (EMC). However, a material of the molding layer 810 is not limited to the EMC and may include various materials (for example, an epoxy-based material, a thermosetting material, a thermoplastic material, and an ultraviolet (UV) processing material).

Recently, a pattern shape of each of the plurality of first redistribution patterns 230 connected to the semiconductor chip 100 may be progressively complicated, and the number of layers provided in the plurality of first redistribution patterns 230 in a horizontal direction may be progressively reduced. As a pattern shape of each of the plurality of first redistribution patterns 230 is progressively complicated and the number of layers of the plurality of first redistribution patterns 230 is progressively reduced, an inductance of the semiconductor package 10 may increase, and power integrity thereof may decrease.

The semiconductor package 10 according to an embodiment may include the UBM pattern 410 and the second redistribution pattern 510, which are disposed on the passivation layer 310 and connect some of the plurality of first redistribution patterns 230. Therefore, a thickness of the redistribution structure 200 of the semiconductor package 10 may decrease, and the semiconductor package 10 may be thin and lightweight.

Also, the semiconductor package 10 according to an embodiment may include the UBM pattern 410 and the second redistribution pattern 510, which are disposed on the passivation layer 310 and connect some of the plurality of first redistribution patterns 230. Therefore, in a case where the semiconductor package 10 is mounted on a package substrate (1100 of FIG. 8) and operates, an inductance of the semiconductor package 10 may decrease, and power integrity thereof may be improved.

Figure 3:
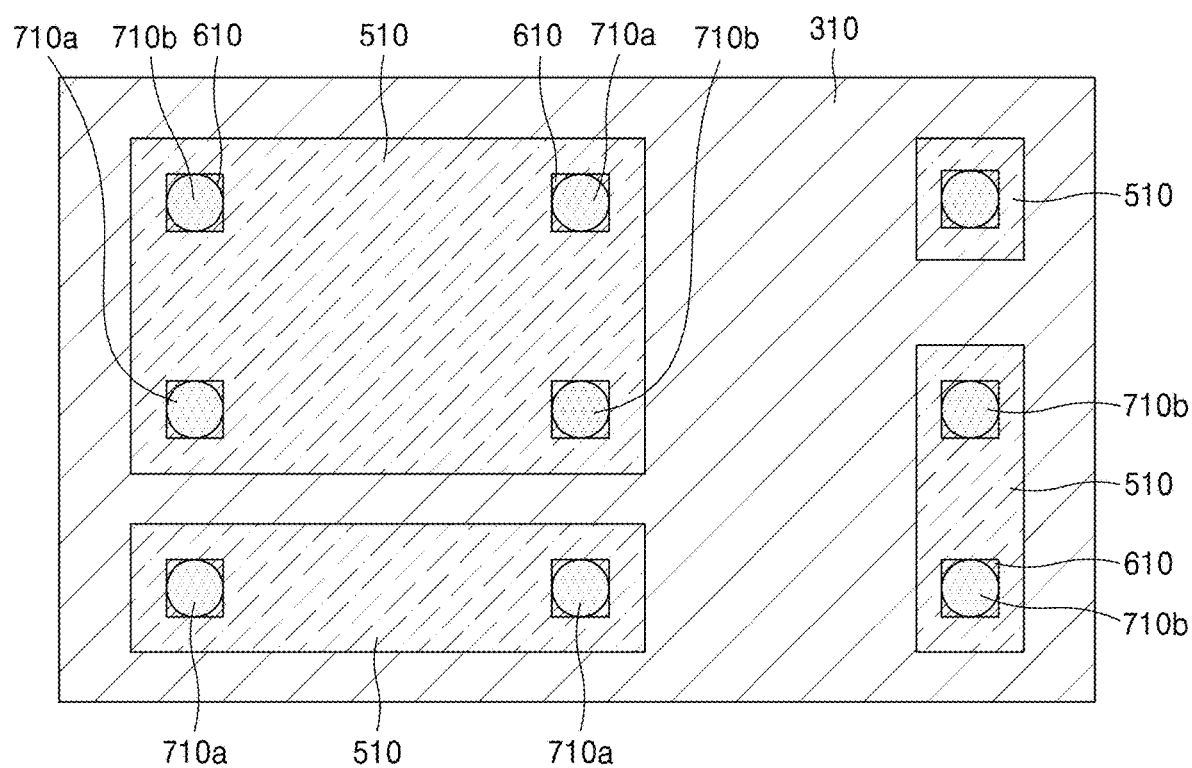
FIGS. 3 and 4 are bottom views illustrating a bottom surface of a portion of the semiconductor package illustrated in FIG. 2.
Figure 4:
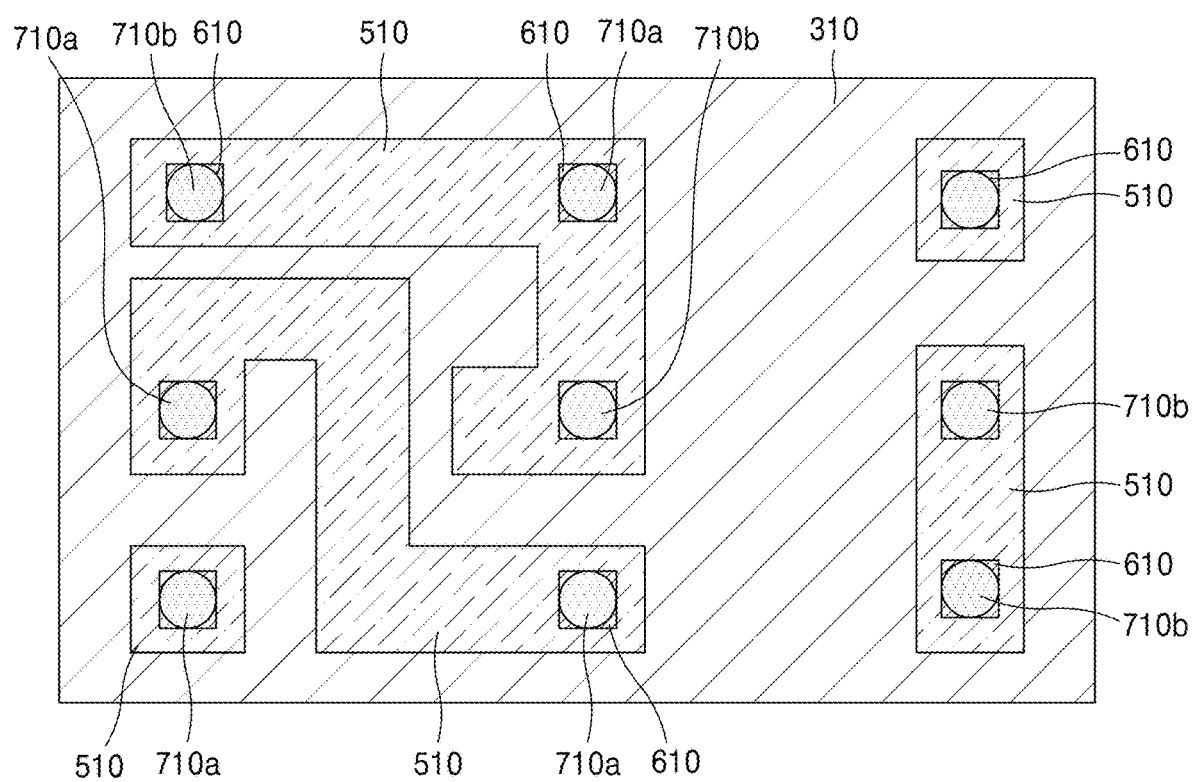

FIGS. 3 and 4 are bottom views illustrating a bottom surface of a portion of the semiconductor package 10 illustrated in FIG. 2.

Referring to FIGS. 3 and 4, when a lower portion of the semiconductor package 10 is seen in terms of a plane, one surface of the second redistribution pattern 510 disposed on the passivation layer 310 may be observed. Also, as described above, the UBM pattern 410 may vertically overlap the second redistribution pattern 510, and a side surface of the UBM pattern 410 and a side surface of the second redistribution pattern 510 may be on the same plane, and thus, when the semiconductor package 10 is seen in terms of a plane, the UBM pattern 410 may not be observed.

As illustrated in FIG. 3, when the semiconductor package 10 is seen in terms of a plane, the second redistribution pattern 510 may have a plate shape. For example, when the semiconductor package 10 is seen in terms of a plane, the semiconductor package 10 may include a plurality of second redistribution patterns 510 having a tetragonal plate shape. Also, sizes of the plurality of second redistribution patterns 510 having a tetragonal plate shape may differ.

Also, as illustrated in FIG. 4, when the semiconductor package 10 is seen in terms of a plane, the semiconductor package 10 may include a plurality of second redistribution patterns 510 having a curved line shape. For example, the semiconductor package 10 may include the plurality of second redistribution patterns 510 having a curved line shape and the plurality of second redistribution patterns 510 having a tetragonal plate shape.

In an embodiment, the second redistribution patterns 510 may electrically connect at least some of the plurality of package connection terminals 710, on the passivation layer 310.

For example, the second redistribution pattern 510 may electrically connect the package connection terminals 710a, having a function of transferring the data signal and/or the control signal, of the plurality of package connection terminals 710.

Also, the second redistribution pattern 510 may electrically connect the package connection terminals 710b, having a function of grounding or supplying power, of the plurality of package connection terminals 710.

However, inventive concepts are not limited thereto, and the second redistribution pattern 510 may electrically connect the package connection terminals 710a having a function of transferring the data signal and/or the control signal to the package connection terminals 710b having a function of grounding or supplying power among the plurality of package connection terminals 710.

Figure 5:
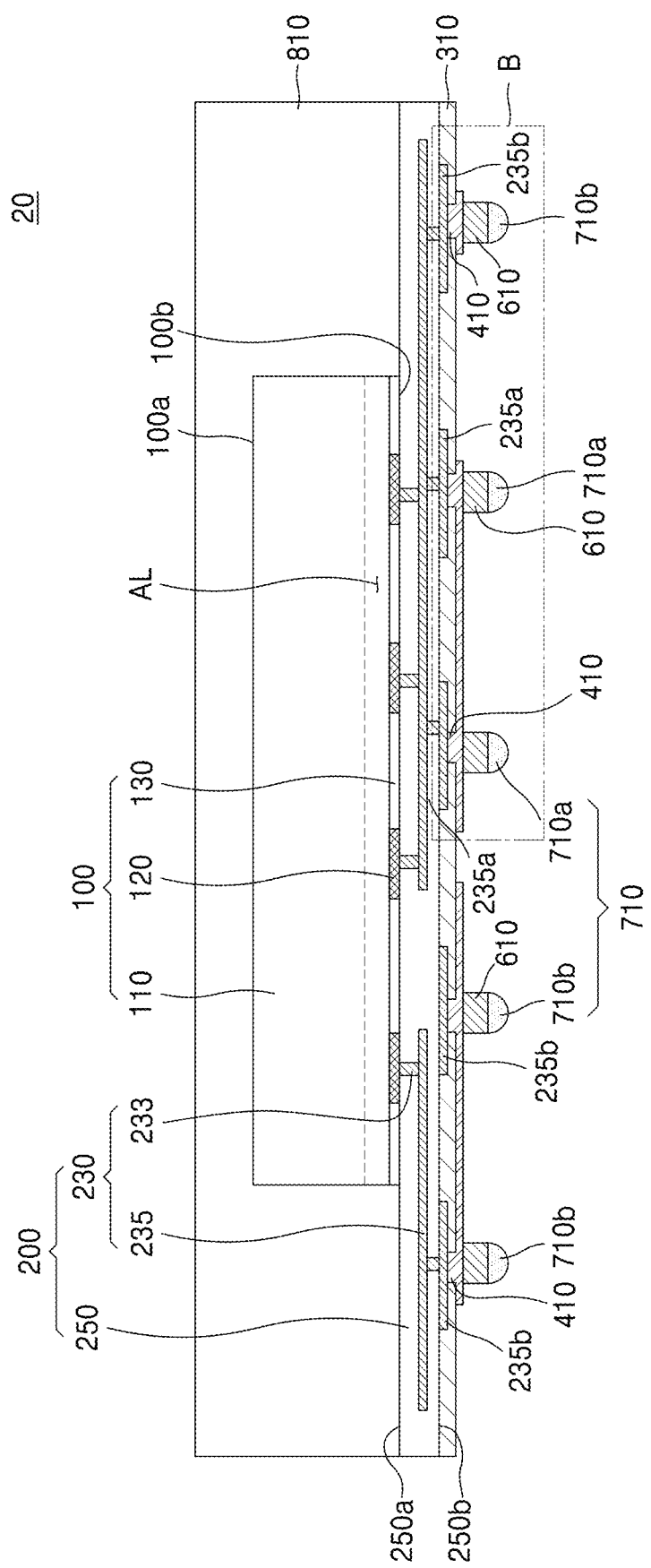
FIG. 5 is a cross-sectional view of a semiconductor package according to an embodiment.
Figure 6:
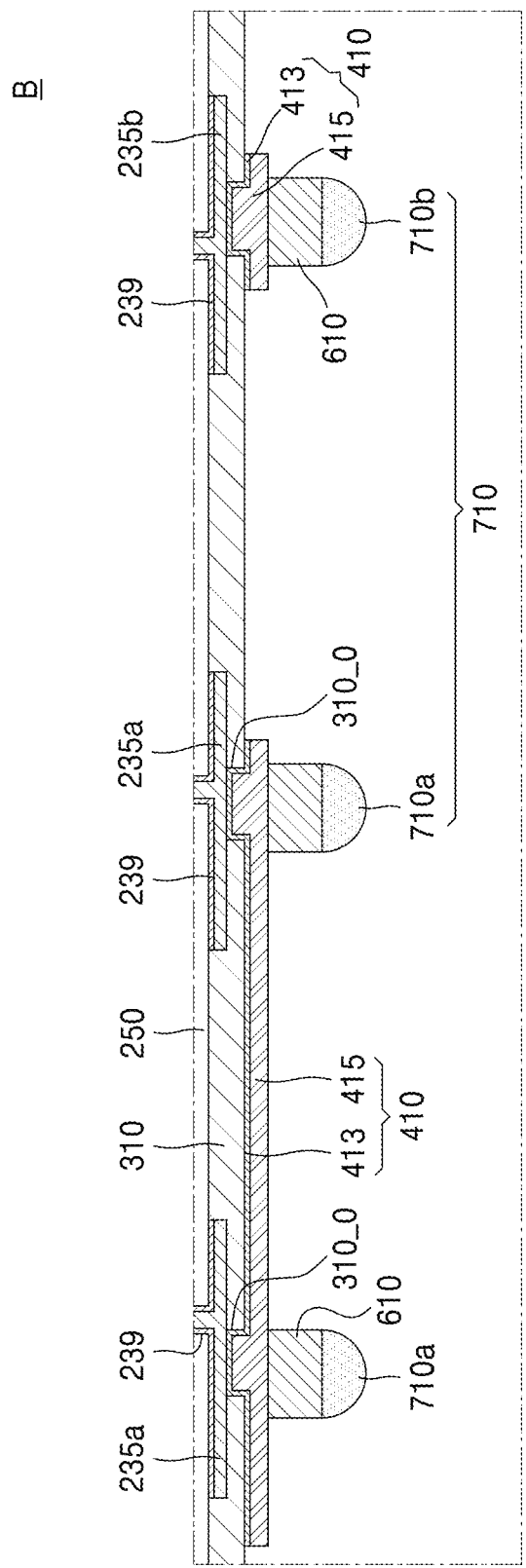
FIG. 6 is an enlarged view of a region B of FIG. 5.

FIG. 5 is a cross-sectional view of a semiconductor package 20 according to an embodiment. FIG. 6 is an enlarged view of a region B of FIG. 5.

The semiconductor package 20 according to an embodiment may include a semiconductor chip 100, a redistribution structure 200 including a first redistribution pattern 230 and a redistribution insulation layer 250, a passivation layer 310, a UBM pattern 410, a conductive pillar 610, a package connection terminal 710, and a molding layer 810.

Hereinafter, a difference between the semiconductor package 10 described above with reference to FIGS. 1 to 4 and the semiconductor package 20 of FIGS. 5 and 6 will be mainly described.

In an embodiment, the UBM pattern 410 may include a conductive material pattern which is filled into a plurality of openings 310_O of the passivation layer 310 and is disposed on a surface of the passivation layer 310.

In an embodiment, the UBM pattern 410 may include a conductive material pattern which connects some of a plurality of redistribution line patterns 235 disposed in a horizontal direction on a bottom surface 200b of the redistribution structure 200.

For example, the UBM pattern 410 may connect a plurality of first signal redistribution line patterns 235a disposed on a bottom surface 250b of the redistribution insulation layer 250.

That is, the UBM pattern 410 may include a pattern which connects a plurality of first signal redistribution line patterns 235a, for transferring a data signal and/or a control signal of the semiconductor chip 100 to the package connection terminal 710.

Also, the UBM pattern 410 may connect a plurality of first power/ground redistribution line patterns 235b disposed on the bottom surface 250b of the redistribution insulation layer 250. That is, the UBM pattern 410 may include a pattern which connects the first power/ground redistribution line patterns 235b, for the supplying and grounding of power of the semiconductor chip 100.

However, inventive concepts are not limited thereto, and the UBM pattern 410 may connect a first signal redistribution line pattern 235a to a first power/ground redistribution line pattern 235b, which are disposed on the bottom surface 250b of the redistribution insulation layer 250.

In an embodiment, the conductive pillar 610 may include a conducive material pillar which extends in a vertical direction on the UBM pattern 410. Also, the conductive pillar 610 may be disposed between the package connection terminal 710 and the UBM pattern 410 and may electrically connect the package connection terminal 710 to the UBM pattern 410.

That is, the semiconductor package 20 according to an embodiment may not include the second redistribution pattern 510 described above with reference to FIG. 1. That is, the semiconductor package 20 may electrically connect some of a plurality of package connection terminals 710 through the UBM pattern 410.

The semiconductor package 20 according to an embodiment may not include the second redistribution pattern 510 described above and may include only the UBM pattern 410.

Therefore, a process of manufacturing the semiconductor package 20 may be simplified, and the semiconductor package 20 may be thin and lightweight.

Also, the semiconductor package 20 according to an embodiment may include the UBM pattern 410 which connects some of the plurality of package connection terminals 710, on the passivation layer 310. Therefore, in a case where the semiconductor package 20 is mounted on a package substrate and operates, an inductance of the semiconductor package 20 may decrease, and power integrity thereof may be improved.

Figure 7:
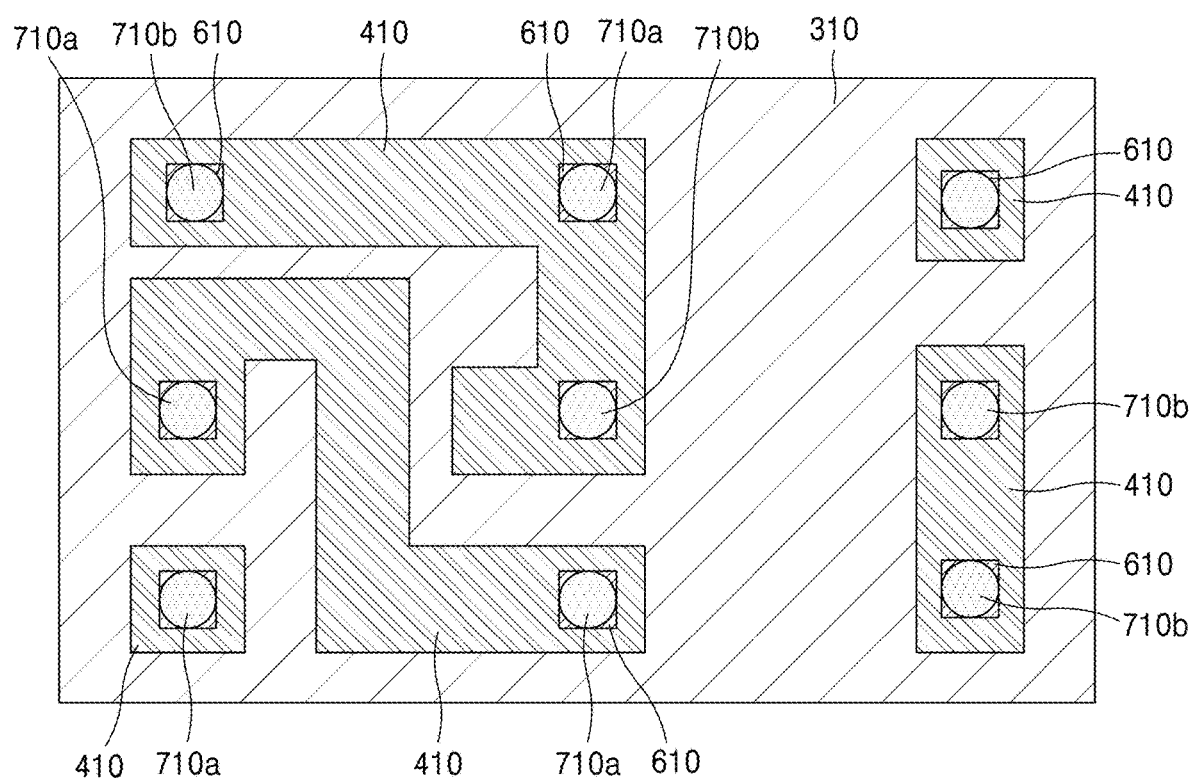
FIG. 7 is a bottom view illustrating a bottom surface of a portion of the semiconductor package illustrated in FIG. 6.

FIG. 7 is a bottom view illustrating a bottom surface of a portion of the semiconductor package 20 illustrated in FIG. 6.

Referring to FIG. 7, when a lower portion of the semiconductor package 20 is seen in terms of a plane, one surface of the UBM pattern 410 disposed on the passivation layer 310 may be observed.

In an embodiment, when the semiconductor package 20 is seen in terms of a plane, the semiconductor package 20 may include the plurality of second redistribution patterns 510 having a curved line shape and the plurality of second redistribution patterns 510 having a tetragonal plate shape.

In an embodiment, the UBM pattern 410 may electrically connect at least some of the plurality of package connection terminals 710, on the passivation layer 310.

For example, the UBM pattern 410 may electrically connect package connection terminals 710a, having a function of transferring the data signal and/or the control signal, of the plurality of package connection terminals 710.

Also, the UBM pattern 410 may electrically connect package connection terminals 710b, having a function of grounding or supplying power, of the plurality of package connection terminals 710.

However, inventive concepts are not limited thereto, and the UBM pattern 410 may electrically connect the package connection terminals 710a having a function of transferring the data signal and/or the control signal to the package connection terminals 710b having a function of grounding or supplying power among the plurality of package connection terminals 710.

FIG. 8 is a cross-sectional view of a semiconductor device 1 according to an embodiment.

Referring to FIG. 8, the semiconductor device 1 may include a semiconductor package 10, a package substrate 1100, an external connection terminal 1700, and an underfill layer 1300.

The technical spirit of the semiconductor package 10 included in the semiconductor device 1 may be the same as or similar to description given above with reference to FIGS. 1 to 4, and thus, its detailed description is omitted.

In an embodiment, the package substrate 1100 may include a substrate for connecting the semiconductor package 10 to an external device. The package substrate 1100 may include a double-sided printed circuit board (PCB) which includes a first package substrate pad 1130 and a second package substrate pad 1150. However, inventive concepts are not limited to the above description, and the package substrate 1100 may include a single-sided PCB including the first package substrate pad 1130 on only one surface thereof.

In an embodiment, the package substrate 1100 is not limited to a structure and a material of a PCB and may include various kinds of substrates such as a ceramic substrate.

In an embodiment, a package connection terminal 710 of the semiconductor package 10 may be disposed between a conductive pillar 610 of the semiconductor package 10 and the first package substrate pad 1130 of the package substrate 1100 and may electrically connect the semiconductor chip 100 to the package substrate 1100.

In an embodiment, the package substrate 1100 may include a package substrate pattern 1230 and a package substrate insulation layer 1250 surrounding the package substrate pattern 1230.

The package substrate pattern 1230 may include a package substrate line pattern 1233 which extends in a horizontal direction in the package substrate insulation layer 1250. Also, the package substrate pattern 1230 may include a package substrate via pattern 1235 which extends in a vertical direction in the package substrate insulation layer 1250 and connects a plurality of package substrate line patterns 1233, connects the package substrate line pattern 1233 to the first package substrate pad 1130, or connects the package substrate line pattern 1233 to the second package substrate pad 1150.

In an embodiment, a material of the package substrate pattern 1230 may include Cu. However, inventive concepts are not limited thereto, and the material of the package substrate pattern 1230 may include metal, such as nickel (Ni), copper (Cu), gold (Au), silver (Ag), tungsten (W), titanium (Ti), tantalum (Ta), indium (In), molybdenum (Mo), cobalt (Co), tin (Sn), magnesium (Mg), rhenium (Re), beryllium (Be), gallium (Ga), or ruthenium (Ru), or an alloy thereof.

A material of the package substrate insulation layer 1250 may include oxide or nitride. For example, the package substrate insulation layer 1250 may include silicon oxide or silicon nitride.

In an embodiment, the package substrate line pattern 1233 may include a plurality of layers which extend in a horizontal direction in the package substrate insulation layer 1250. For example, the package substrate line pattern 1233 may include three layers which extend in a horizontal direction in the package substrate insulation layer 1250.

The external connection terminal 1700 may include a connection terminal which is attached on the second package substrate pad 1150 and connects the semiconductor package 10 to an external device. For example, the external connection terminal 1700 may include a solder ball including a metal material, which includes at least one material of Sn, Ag, Cu, and Al.

In an embodiment, the underfill layer 1300 may be configured to fix the semiconductor package 10 to the package substrate 1100. The underfill layer 1300 may be disposed between the semiconductor package 10 and the package substrate 1100 and may fix the semiconductor package 10 to the package substrate 1100.

In an embodiment, a portion of the underfill layer 1300 may surround at least a portion of a side surface of the semiconductor package 10. Also, the underfill layer 1300 may have a tapered shape where a cross-sectional area thereof in a horizontal direction increases toward the package substrate 1100.

In an embodiment, the underfill layer 1300 may include at least one of an insulating polymer and an epoxy resin. For example, the underfill layer 1300 may include an EMC.

In order to manufacture the semiconductor device 1 which is thin and lightweight, it may be required to decrease the number of layers of the package substrate line pattern 1233 extending in a horizontal direction in the package substrate insulation layer 1250.

As the number of layers of the package substrate line pattern 1233 is progressively reduced and a pattern shape of the package substrate line pattern 1233 is progressively complicated, an inductance of the semiconductor package 10 connected to the package substrate 1100 may increase, and power integrity thereof may decrease.

The semiconductor package 10 included in the semiconductor device 1 according to an embodiment may include the UBM pattern 410 and the second redistribution pattern 510, which are disposed on the passivation layer 310 and connect some of the plurality of package connection terminals 710.

Therefore, the number of layers of the package substrate line pattern 1233 extending in a horizontal direction in the package substrate insulation layer 1250, and the package substrate 1100 and the semiconductor device 1 including the package substrate 1100 may be thin and lightweight.

Also, the semiconductor device 1 according to an embodiment may include the UBM pattern 410 and the second redistribution pattern 510, which are disposed on the passivation layer 310 and connect some of the plurality of package connection terminals 710. Therefore, an inductance of the semiconductor package 10 connected to the package substrate 1100 may decrease, and power integrity thereof may be improved.

Figure 9:
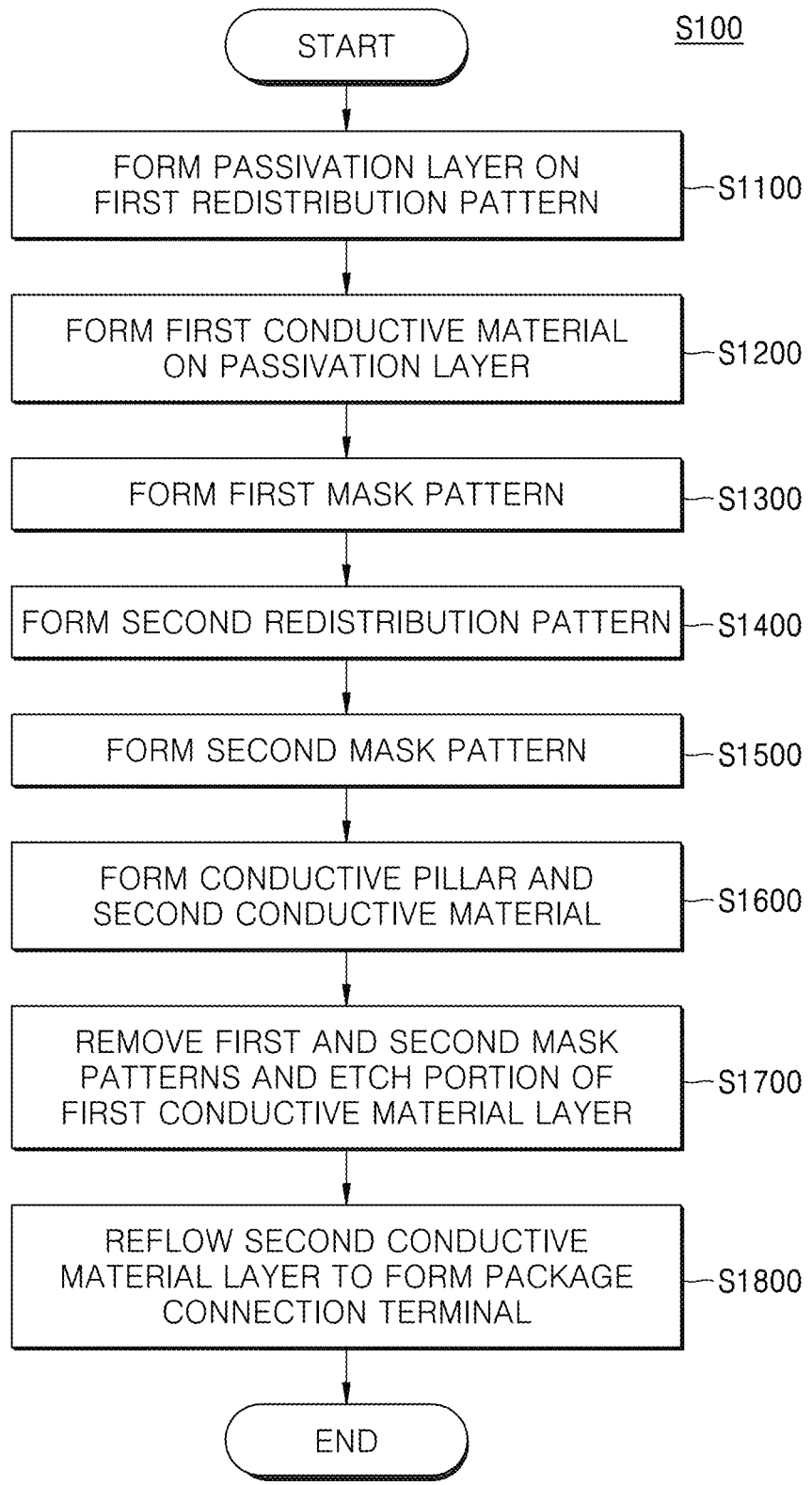
FIG. 9 is a flowchart illustrating a method of manufacturing a semiconductor package, according to an embodiment.

FIG. 9 is a flowchart illustrating a method S100 of manufacturing a semiconductor package 10, according to an embodiment. Also, FIGS. 10 to 18 are diagrams respectively illustrating operations of the method S100 of manufacturing the semiconductor package 10, according to an embodiment.

The method S100 of manufacturing the semiconductor package 10 according to an embodiment may include a method of manufacturing the semiconductor package 10 described above with reference to FIGS. 1 to 4.

Referring to FIG. 9, the method S100 of manufacturing the semiconductor package 10 according to an embodiment may include operation S1100 of forming a passivation layer 310 on a first redistribution pattern 230, operation S1200 of forming a first conductive material layer ML1 on the passivation layer 310, operation S1300 of forming a first mask pattern MP1, operation S1400 of forming a second redistribution pattern 510, operation S1500 of forming a second mask pattern MP2, operation S1600 of forming a conductive pillar 610 and a second conductive material layer ML2, operation S1700 of removing the first mask pattern MP1 and the second mask pattern MP2 and etching a portion of the first conductive material layer ML1 to form a UBM pattern 410, and operation S1800 of reflowing the second conductive material layer ML2 to form a package connection terminal 710.

Figure 10:
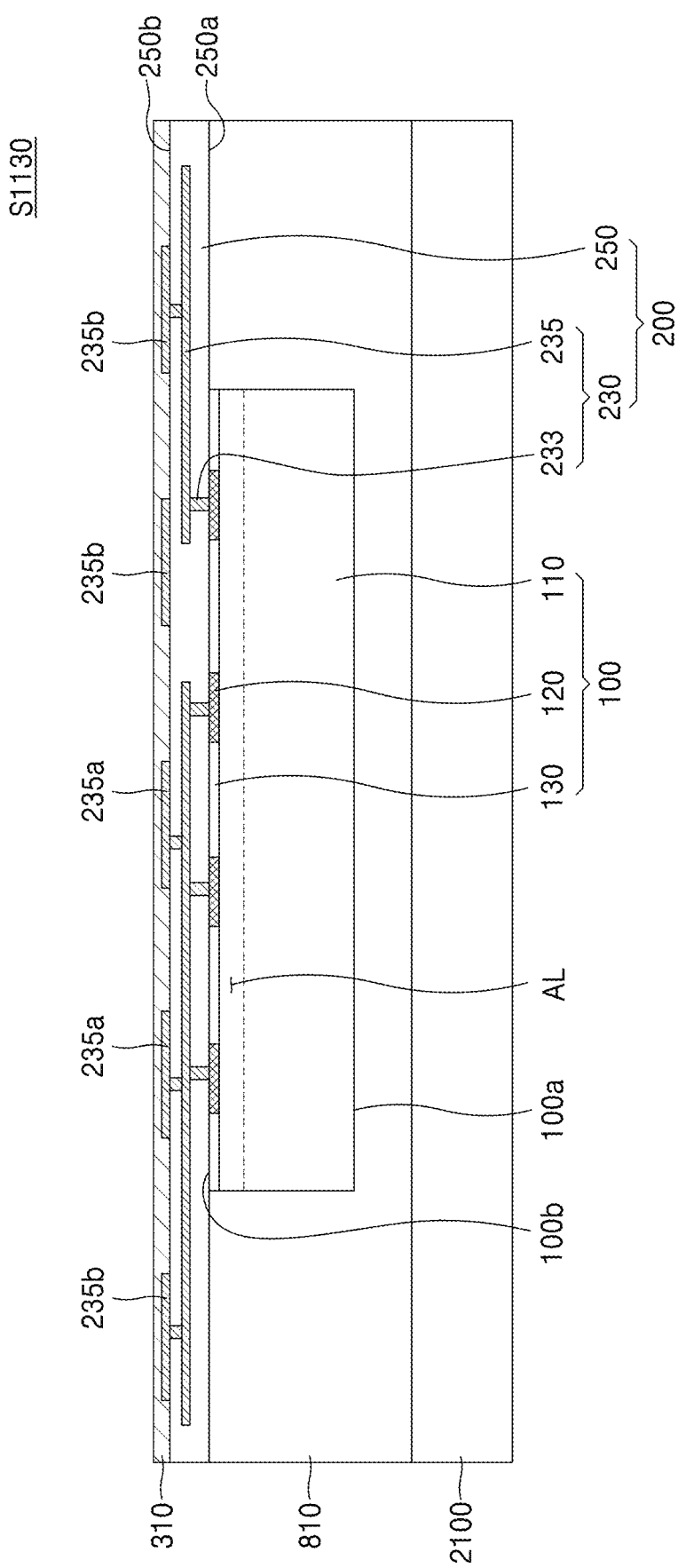
FIGS. 10 to 18 are diagrams respectively illustrating operations of a method of manufacturing a semiconductor package, according to an embodiment.
Figure 11:
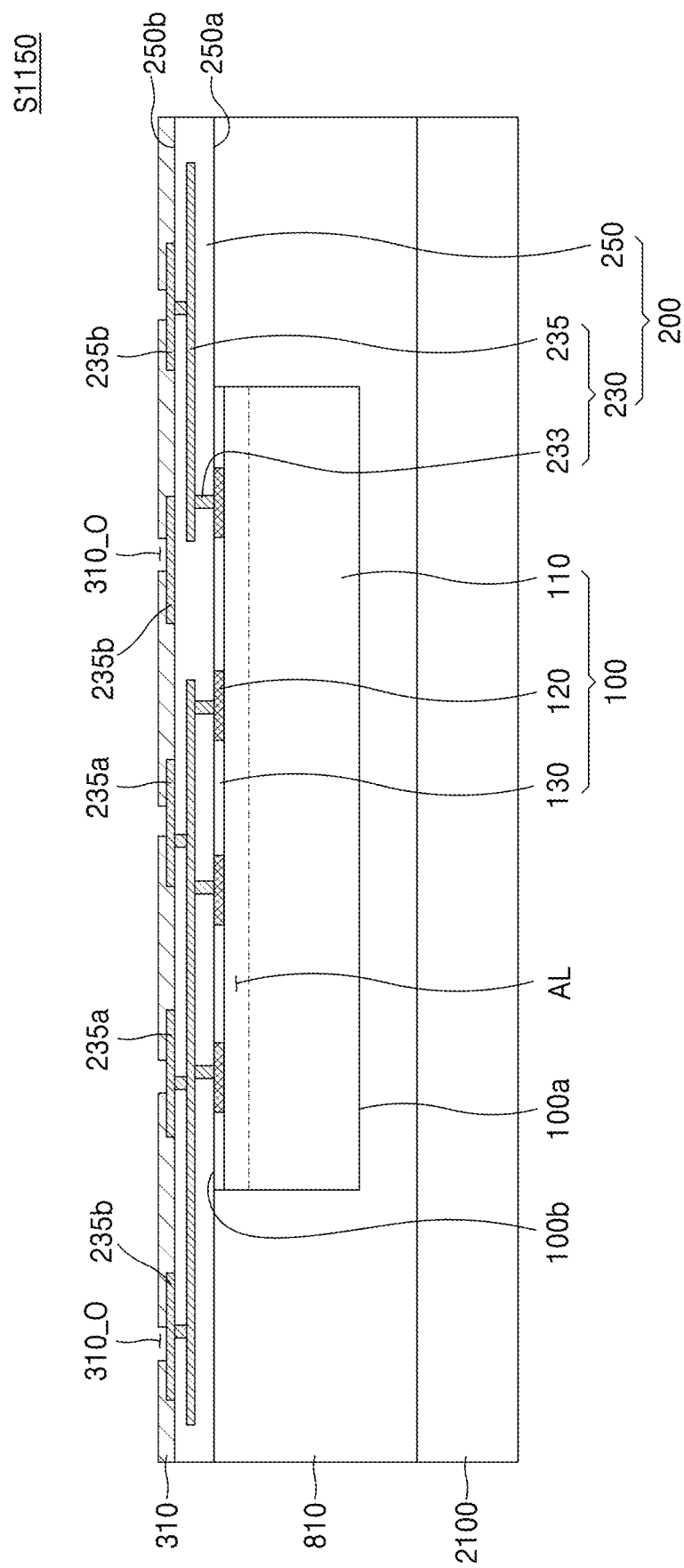

Referring to FIGS. 9 to 11, the method S100 of manufacturing the semiconductor package 10 according to an embodiment may include operation S1100 of forming the passivation layer 310 on the first redistribution pattern 230.

Also, operation S1100 may include operation S1130 of coating the passivation layer 310 on the first redistribution pattern 230 and operation S1150 of forming an opening 310_O, exposing a portion of the first redistribution pattern 230, in the passivation layer 310.

Before performing operation S1100, a carrier substrate 2100 may be attached on one surface of a molding layer 810. The carrier substrate 2100 may include a substrate including an arbitrary material having stability corresponding to a baking process and an etching process.

In an embodiment, in a case where the carrier substrate 2100 is to be detached and removed through laser ablation, the carrier substrate 2100 may include a transmissive substrate. Also, in a case where the carrier substrate 2100 is to be detached and removed by heating, the carrier substrate 2100 may include a heat-resistant substrate.

In an embodiment, the carrier substrate 2100 may include a glass substrate. However, inventive concepts are not limited thereto, and the carrier substrate 2100 may include a heat-resistant organic polymer material such as polyimide (PI), polyetheretherketone (PEEK), polyethersulfone (PES), and polyphenylene sulfide (PPS) but is not limited thereto.

A release film (not shown) may be attached on one surface of the carrier substrate 2100. For example, the release film may include a laser reaction layer which reacts on a laser irradiated thereon to be vaporized, and thus, detaches the carrier substrate 2100 from the molding layer 810. The release film may include a carbon-based material layer. For example, the release film may include an amorphous carbon layer (ACL).

Operation S1130 may include an operation of coating the passivation layer 310 through a spin coating process performed on a redistribution structure 200. In an embodiment, the passivation layer 310 may be coated on the redistribution structure 200 and may surround a first redistribution pattern 230 arranged on a bottom surface 200b of the redistribution structure 200.

Operation S1150 may include an operation of forming an opening 310_O, exposing a portion of the first redistribution pattern 230, in the passivation layer 310. In an embodiment, the opening 310_O of the passivation layer 310 may be formed through an etching process or a laser drilling process. Also, the opening 310_O of the passivation layer 310 may vertically overlap a portion of the first redistribution pattern 230 arranged on the bottom surface 200b of the redistribution structure 200.

Figure 12:
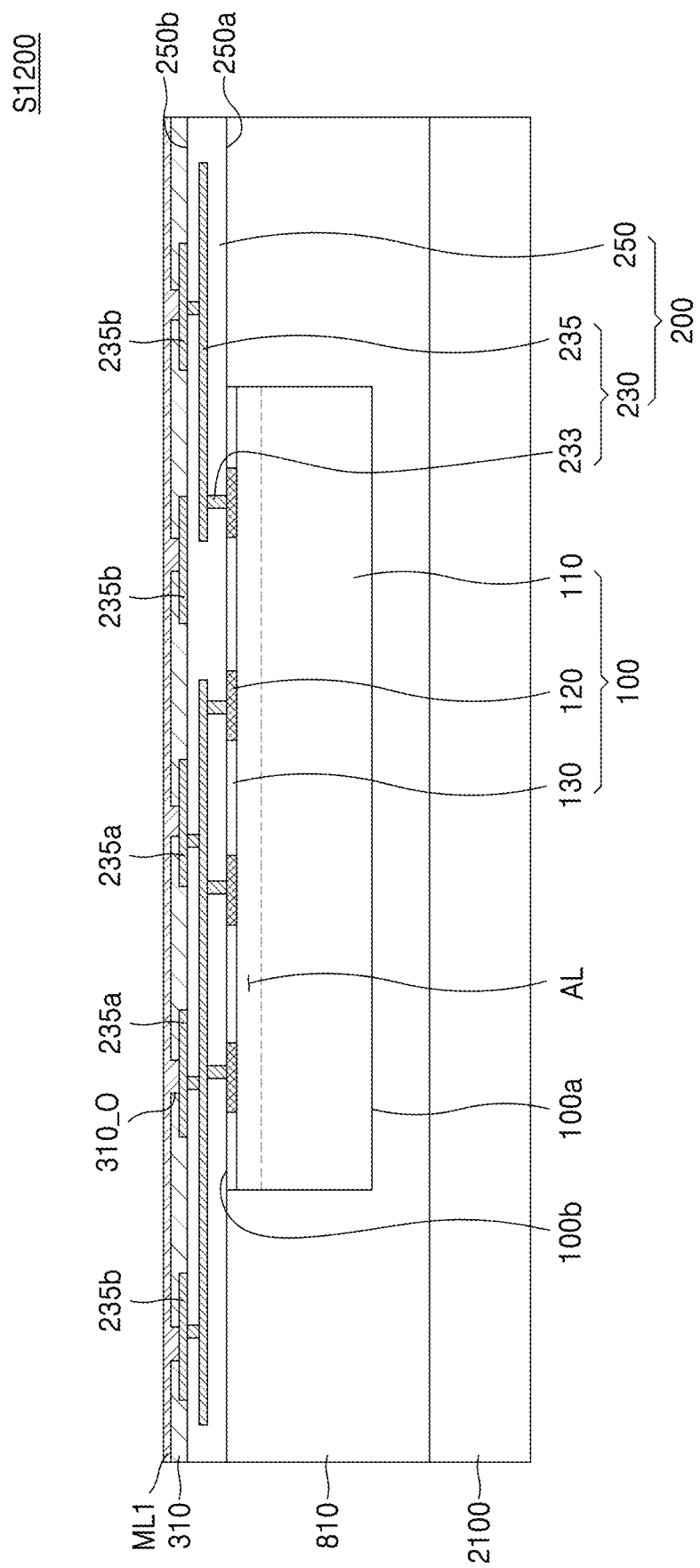

Referring to FIGS. 9 and 12, the method S100 of manufacturing the semiconductor package 10 according to an embodiment may include operation S1200 of forming the first conductive material layer ML1 on the passivation layer 310. In an embodiment, the first conductive material layer ML1 may be conformally formed along a surface of the passivation layer 310 and a surface of the first redistribution pattern 230 exposed by the opening 310_O of the passivation layer 310.

In an embodiment, the first conductive material layer ML1 may include a layer for forming a UBM pattern 410 of the semiconductor package 10. The first conductive material layer ML1 may include a plurality of metal material layers.

For example, the first conductive material layer ML1 may include a first seed layer (not shown) on the passivation layer 310 and a first metal layer (not shown) on the first seed layer. The first seed layer may include a layer forming a UBM seed layer 413 of the UBM pattern 410, and the first metal layer may include a layer for forming a UBM conductive layer 415 of the UBM pattern 410.

In an embodiment, the first seed layer of the first conductive material layer ML1 may be formed by performing a PVD process, and the first metal layer of the first conductive material layer ML1 may be formed through a plating process using the first seed layer. For example, a structure of the first conductive material layer ML1 may include Cu/Ti, where Cu is stacked on Ti, or Cu/TiW, where Cu is stacked on TiW.

Figure 13:
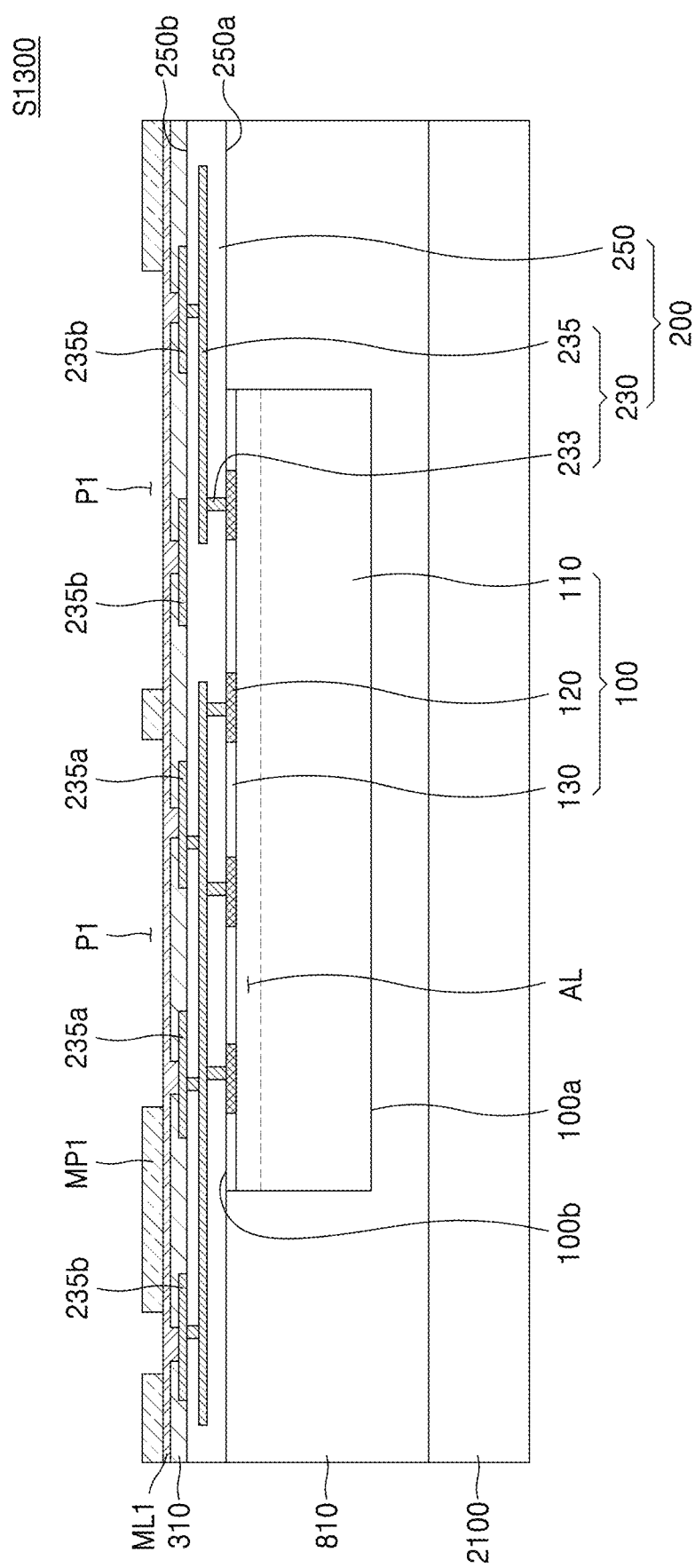

Referring to FIGS. 9 and 13, the method S100 of manufacturing the semiconductor package 10 according to an embodiment may include operation S1300 of forming the first mask pattern MP1, including a first pattern P1, on the first conductive material layer ML1.

In an embodiment, operation S1300 of forming the first mask pattern MP1 may include an operation of coating a photoresist layer on the first conductive material layer ML1 and an operation of patterning the photoresist layer through an exposure process and a development process to form the first mask pattern MP1 including the first pattern P1. For example, the photoresist layer may include a photosensitive polymer reacting to light.

Figure 14:
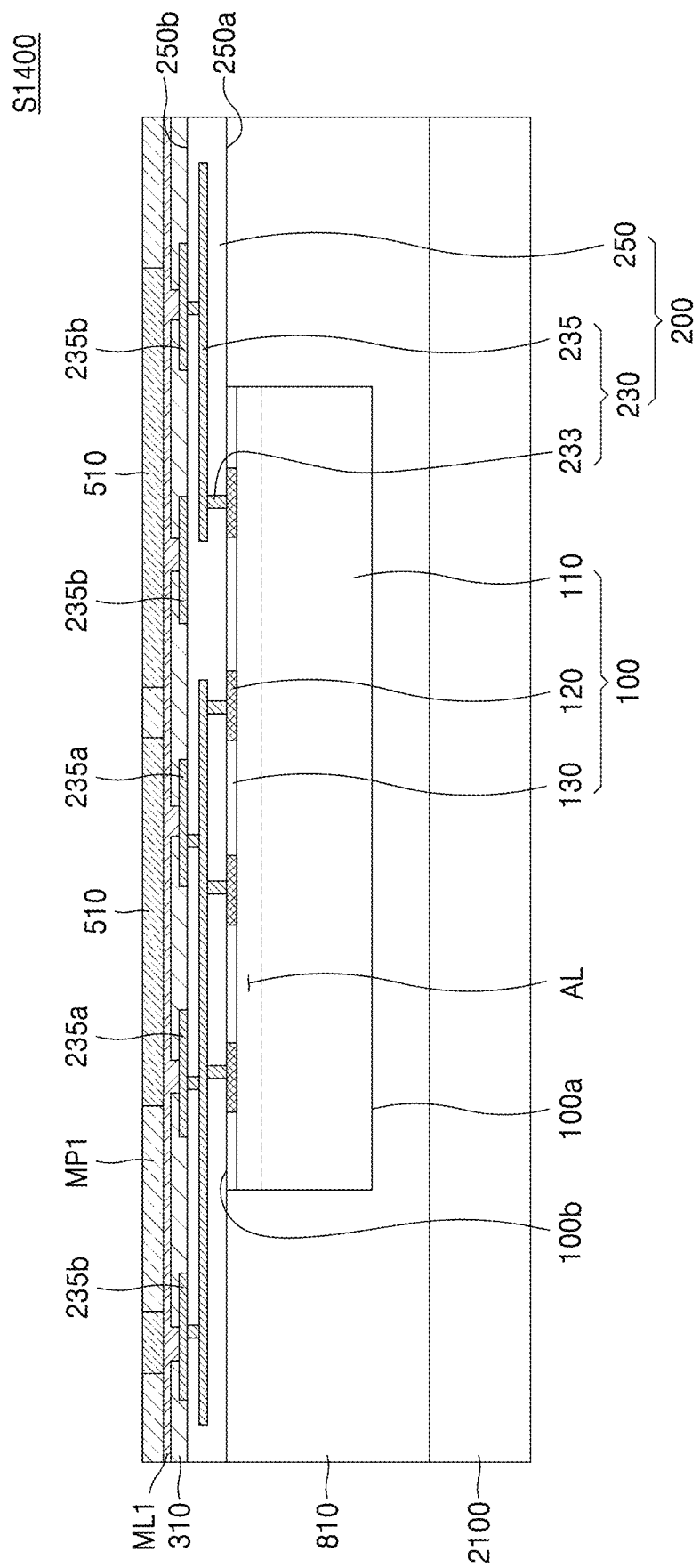

Referring to FIGS. 9 and 14, the method S100 of manufacturing the semiconductor package 10 according to an embodiment may include operation S1400 of forming the second redistribution pattern 510 on the first conductive material layer ML1.

In an embodiment, operation S1400 may include an operation of forming the second redistribution pattern 510 on a surface of the first conductive material layer ML1 exposed by the first mask pattern MP1 by using a plating process.

In an embodiment, the second redistribution pattern 510 may be formed on the first conductive material layer ML1 to have a thickness of about 3 µm to about 10 µm. For example, the second redistribution pattern 510 may be formed on the first conductive material layer ML1 to have a thickness of about 5 µm.

In an embodiment, operation S1400 may include an operation of forming a second redistribution seed layer (519 of FIG. 2) on the surface of the first conductive material layer ML1 exposed by the first mask pattern MP1 and an operation of forming a second redistribution line pattern (513 of FIG. 2), extending in a horizontal direction, on the second redistribution seed layer 519.

In an embodiment, the second redistribution seed layer 519 of the second redistribution pattern 510 may be formed by performing a PVD process, and the second redistribution line pattern 513 of the second redistribution pattern 510 may be formed by performing a plating process using the second redistribution seed layer 519. For example, a structure of the second redistribution pattern 510 may include Cu/Ti, where Cu is stacked on Ti, or Cu/TiW, where Cu is stacked on TiW.

Figure 15:
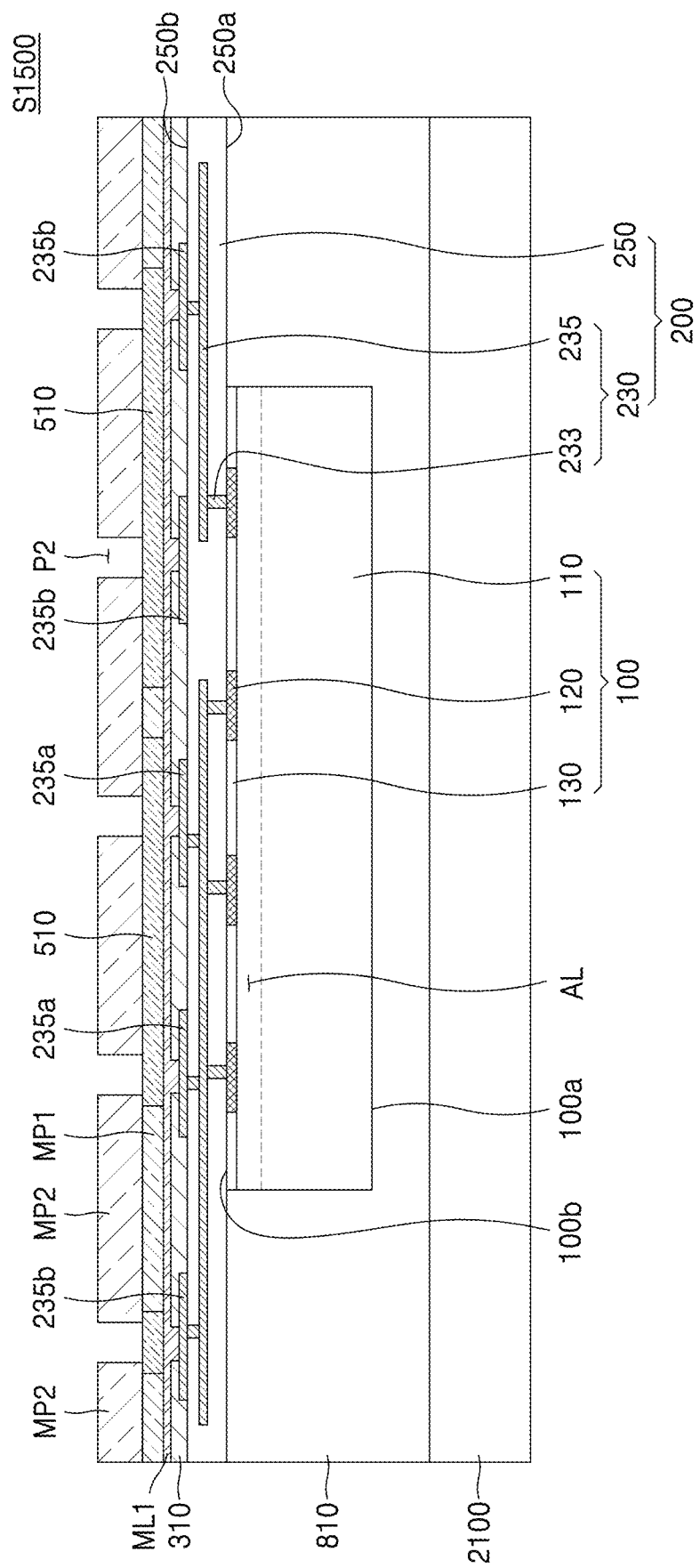

Referring to FIGS. 9 and 15, the method S100 of manufacturing the semiconductor package 10 according to an embodiment may include operation S1500 of forming the second mask pattern MP2, including a second pattern P2, on a surface of each of the first mask pattern MP1 and the second redistribution pattern 510.

In an embodiment, operation S1500 may include an operation of coating a photoresist layer on the surface of each of the first mask pattern MP1 and the second redistribution pattern 510 and an operation of patterning the photoresist layer through an exposure process and a development process to form the second mask pattern MP2 including the second pattern P2. For example, the second pattern P2 of the second mask pattern MP2 may include an opening which exposes a portion of a surface of the second redistribution pattern 510.

Figure 16:
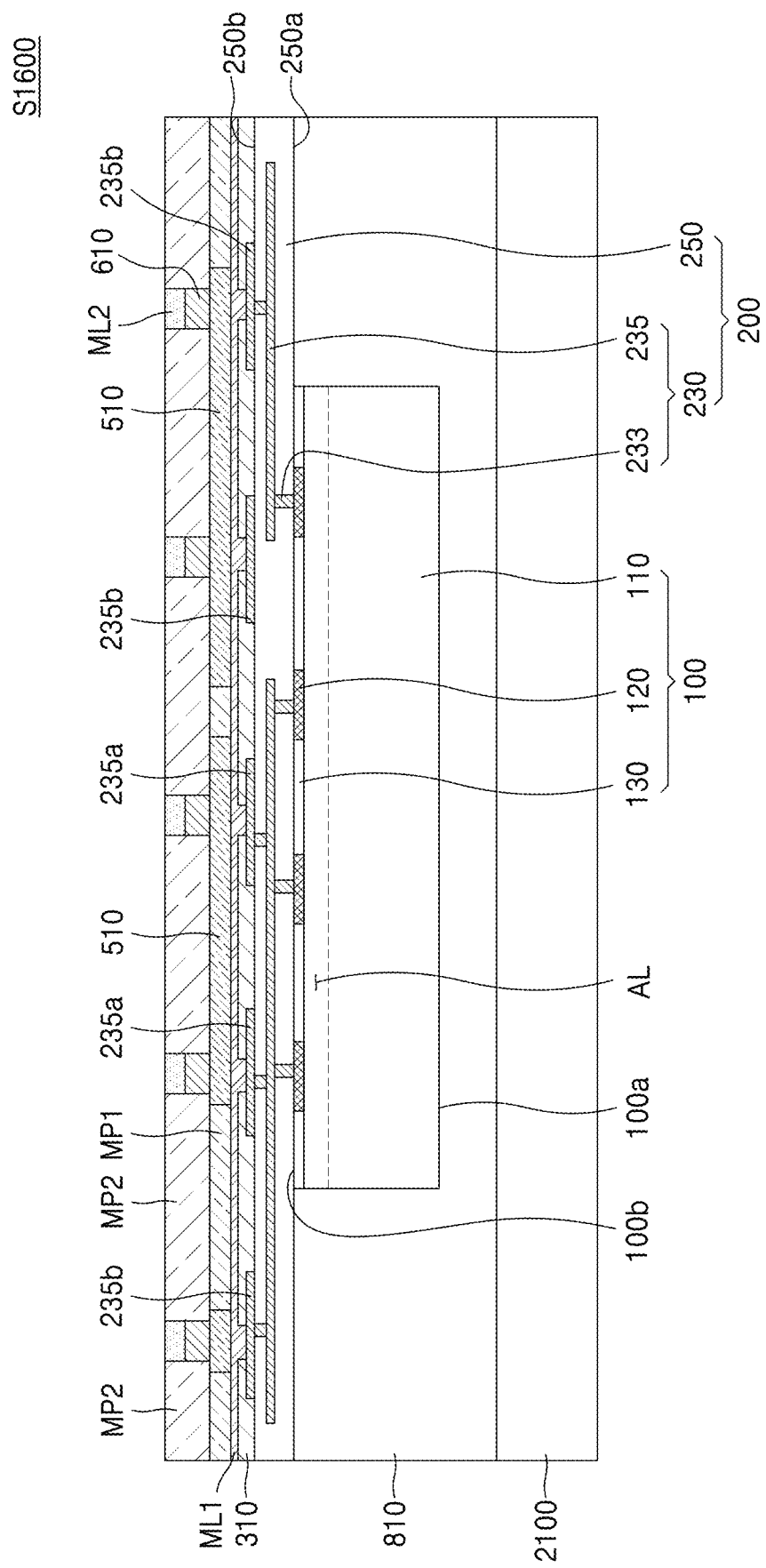

Referring to FIGS. 9 and 16, the method S100 of manufacturing the semiconductor package 10 according to an embodiment may include operation S1600 of forming a conductive pillar 610 and the second conductive material layer ML2.

In operation S1600, the conductive pillar 610 may be filled into an inner portion of the second pattern P2 of the second mask pattern MP2 and may be connected to the second redistribution pattern 510, through a plating process.

In an embodiment, the conductive pillar 610 may be formed on the second redistribution pattern 510 to have a thickness of about 5 µm to about 20 µm. For example, the conductive pillar 610 may have a thickness of about 10 µm on the second distribution pattern 510.

In an embodiment, a material of the conductive pillar 610 may include Cu. However, inventive concepts are not limited thereto, and the material of the conductive pillar 610 may include metal, such as nickel (Ni), copper (Cu), gold (Au), silver (Ag), tungsten (W), titanium (Ti), tantalum (Ta), indium (In), molybdenum (Mo), cobalt (Co), tin (Sn), magnesium (Mg), rhenium (Re), beryllium (Be), gallium (Ga), or ruthenium (Ru), or an alloy thereof.

In operation S1600, the second conductive material layer ML2 may be filled into an inner portion of the second pattern P2 of the second mask pattern MP2 and may be connected to the conductive pillar 610, through a plating process. The second conductive material layer MU may include a layer for forming a package connection terminal (710 of FIG. 1).

In an embodiment, the second conductive material layer ML2 may have a thickness of about 15 µm to about 30 µm on the conductive pillar 610.

In an embodiment, the second conductive material layer ML2 may include a solder ball including a metal material, which includes at least one material of Sn, Ag, Cu, and Al.

Figure 17:
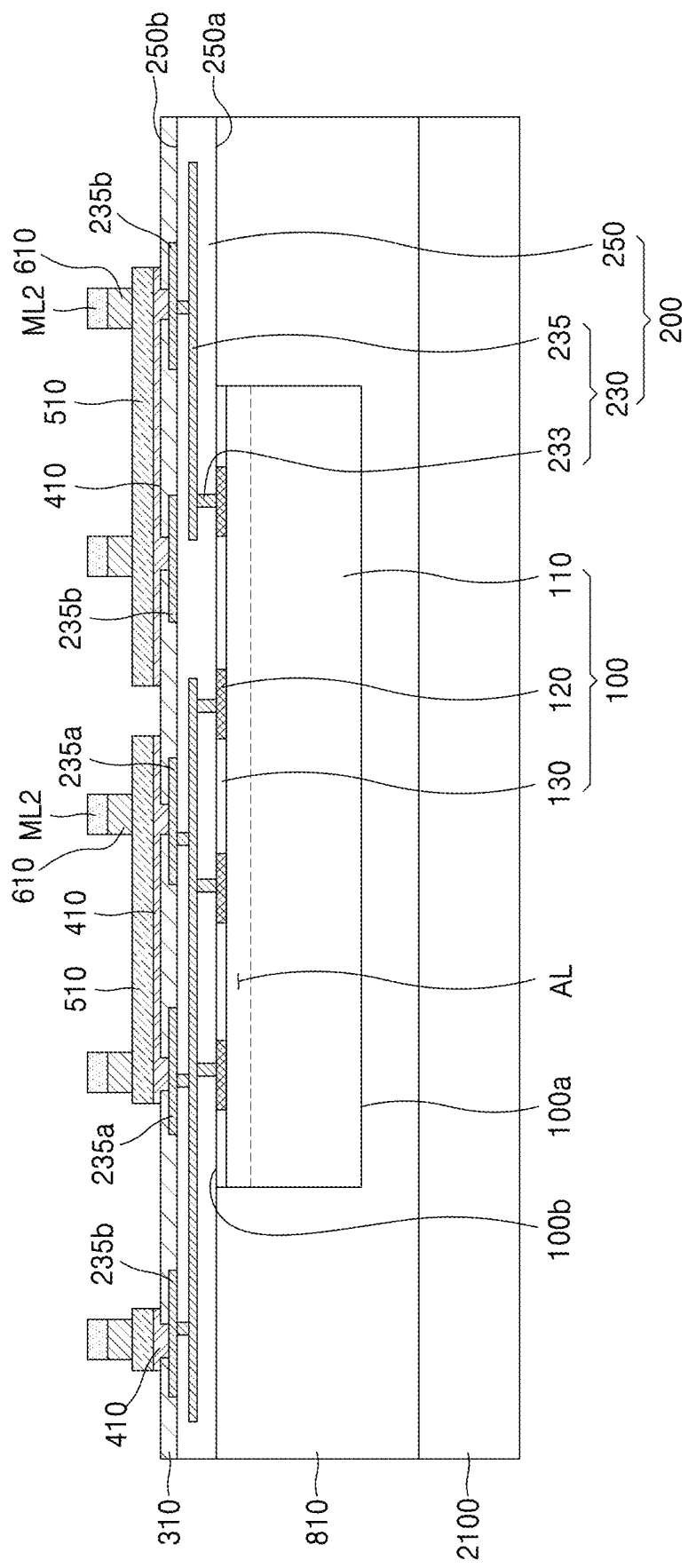

Referring to FIGS. 9 and 17, the method S100 of manufacturing the semiconductor package 10 according to an embodiment may include operation S1700 of removing the first mask pattern MP1 and the second mask pattern MP2 and etching a portion of the first conductive material layer ML1 to form a UBM pattern 410.

In operation S1700, the first mask pattern MP1 and the second mask pattern MP2 may be removed through an ashing process and a strip process. However, inventive concepts are not limited thereto, and the first mask pattern MP1 and the second mask pattern MP2 may be removed by various processes.

Also, in an operation of removing the first mask pattern MP1 and the second mask pattern MP2, a portion of the first conductive material layer ML1 may be etched together. In an embodiment, the first conductive material layer ML1 vertically overlapping the first mask pattern MP1 may be etched.

For example, an operation of etching a portion of the first conductive material layer ML1 may include a process of etching the first conductive material layer ML1 vertically overlapping the first mask pattern MP1 through a chemical mechanical polishing (CMP) process or an etch-back process by using the passivation layer 310 as a stopper.

The first conductive material layer ML1, remaining after operation S1700 is performed, may configure the UBM pattern 410 described above with reference to FIG. 1. When a structure of FIG. 17 is seen in terms of a plane, the UBM pattern 410 may vertically overlap the second redistribution pattern 510, and a side surface of the UBM pattern 410 may be on the same plane as a side surface of the second redistribution pattern 510. That is, the UBM pattern 410 may include a pattern having the same shape as that of the second redistribution pattern 510.

Figure 18:
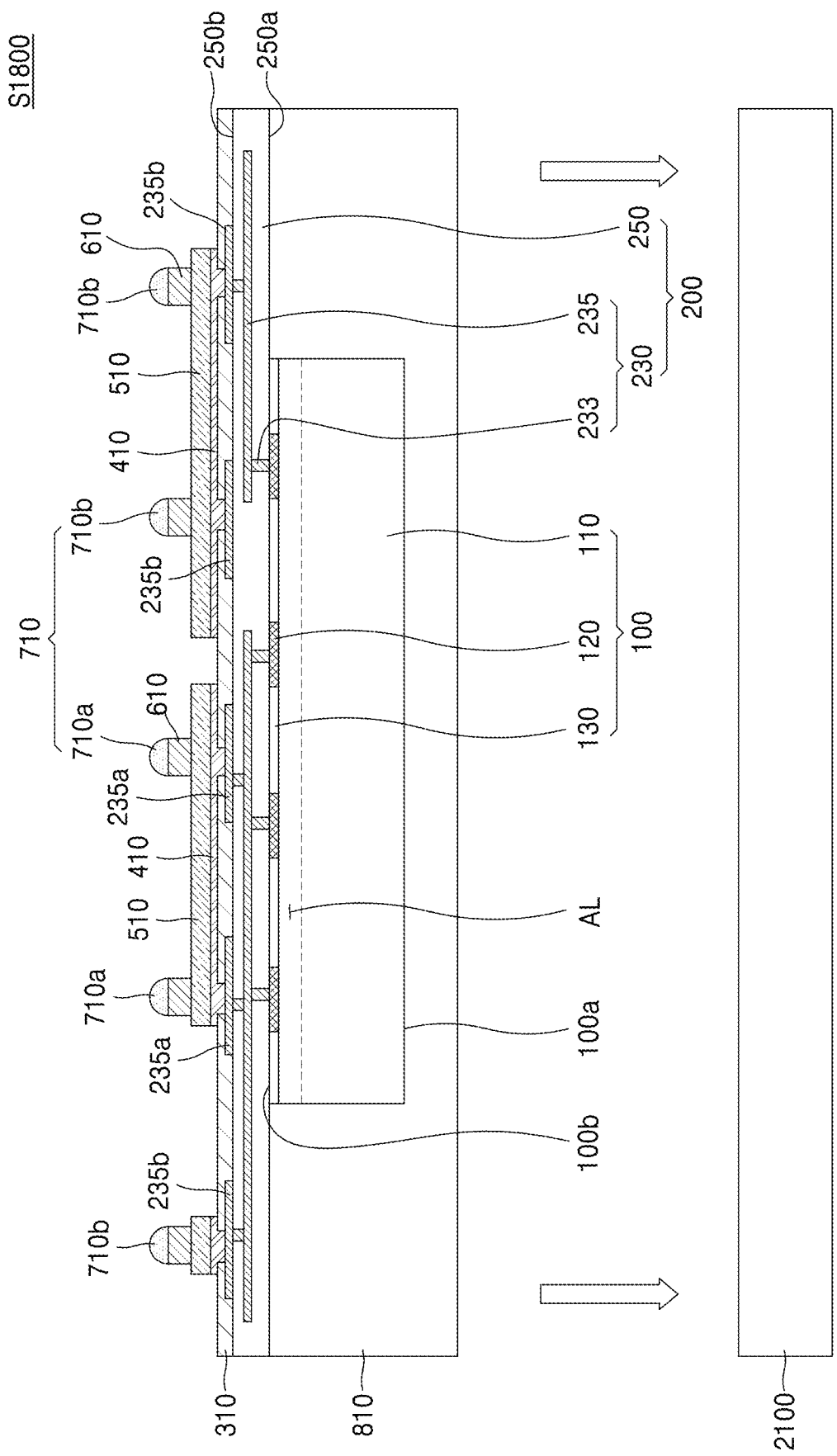

Referring to FIGS. 9 and 18, the method S100 of manufacturing the semiconductor package 10 according to an embodiment may include operation S1800 of reflowing the second conductive material layer ML2 to form the package connection terminal 710.

In an embodiment, in operation S1800, the second conductive material layer ML2 may be melted, and thus, may be solidly bonded to one surface of the conductive pillar 610. The second conductive material layer ML2 may be formed as a package connection terminal 710 having a ball shape through a reflow process.

In an embodiment, some of the plurality of package connection terminals 710 may be connected to one another through the UBM pattern 410 and the second redistribution pattern 510. For example, package connection terminals 710a, having a function of transferring a data signal and/or a control signal, of the plurality of package connection terminals 710 may be electrically connected to one another through the UBM pattern 410 and the second redistribution pattern 510.

Also, package connection terminals 710b, having a function of grounding or supplying power, of the plurality of package connection terminals 710 may be electrically connected to one another through the UBM pattern 410 and the second redistribution pattern 510.

After operation S1800 is performed, a carrier substrate 2100 attached on one surface of a molding layer 810 may be removed. In an embodiment, the carrier substrate 2100 may be detached through laser ablation and may be attached by heating.

The semiconductor package 10 manufactured by the method S100 of manufacturing the semiconductor package 10 according to an embodiment may include the UBM pattern 410 and the second redistribution pattern 510, which are disposed on the passivation layer 310 and electrically connect some of a plurality of package connection terminals 710.

Therefore, a thickness of the redistribution structure 200 of the semiconductor package 10 may decrease, and the semiconductor package 10 may be thin and lightweight. Also, in a case where the semiconductor package 10 is mounted on a package substrate (1100 of FIG. 8) and operates, an inductance of the semiconductor package 10 may decrease, and power integrity thereof may be improved.

The method S100 of manufacturing the semiconductor package 10 according to an embodiment may omit operation S1400 of forming the second redistribution pattern 510. In a case where operation S1400 is omitted and the method S100 of manufacturing the semiconductor package 10 is performed, the semiconductor package 20 described above with reference to FIGS. 6 and 7 may be manufactured. That is, in the semiconductor package 20, some of the plurality of package connection terminals 710 may be electrically connected to one another through the UBM pattern 410 on the passivation layer 310.

While inventive concepts has been particularly shown and described with reference to embodiments thereof, it will be understood that various changes in form and details may be made therein without departing from the spirit and scope of the following claims.

What is claimed is:

1. A semiconductor package comprising:
   a semiconductor chip including a chip pad;
   a redistribution structure including a redistribution insulation layer on the semiconductor chip and a plurality of first redistribution patterns on a surface of the redistribution insulation layer, the plurality of first redistribution patterns being connected to the chip pad;
   a passivation layer covering the plurality of first redistribution patterns, the passivation layer being on the redistribution structure and including an opening vertically overlapping a portion of each of the plurality of first redistribution patterns, a first surface of the passivation layer facing the redistribution structure and a second surface of the passivation layer being opposite the first surface of the passivation layer;
   an under-bump metal (UBM) pattern on the second surface of the passivation layer and extending into the opening of the passivation layer;
   a second redistribution pattern on the UBM pattern, the second redistribution pattern connecting some of the plurality of first redistribution patterns to each other;
   a plurality of conductive pillars on the second redistribution pattern, some of the plurality of conductive pillars being connected to one another through the second redistribution pattern; and
   a package connection terminal on the plurality of conductive pillars.

2. The semiconductor package of claim 1, wherein, in a plan view of the semiconductor package, the UBM pattern and the second redistribution pattern overlap each other in a vertical direction.

3. The semiconductor package of claim 2, wherein a side surface of the second redistribution pattern is on a same plane as a side surface of the UBM pattern.

4. The semiconductor package of claim 1, wherein the plurality of first redistribution patterns comprise:
   a plurality of signal redistribution patterns configured to transfer a data signal or a control signal between the semiconductor chip and the package connection terminal; and
   a plurality of power/ground redistribution patterns configured to supply power to the semiconductor chip or to ground the semiconductor chip.

5. The semiconductor package of claim 4, wherein the second redistribution pattern connects at least two of the plurality of signal redistribution patterns to each other and connects at least two of the plurality of power/ground redistribution patterns to each other.

6. The semiconductor package of claim 4, wherein the second redistribution pattern connects some of the plurality of signal redistribution patterns to some of the plurality of power/ground redistribution patterns.

7. The semiconductor package of claim 1, wherein, in a plan view of the semiconductor package, a width of the plurality of conductive pillars is less than a width of the second redistribution pattern.

8. The semiconductor package of claim 1, wherein, in a plan view of the semiconductor package, a shape of the second redistribution pattern comprises at least one of a tetragonal plate shape and a curved line shape.

9. The semiconductor package of claim 1, wherein the UBM pattern comprises:
   a UBM seed layer conformally formed along the plurality of first redistribution patterns and the second surface of the passivation layer; and
   a UBM conductive layer between the UBM seed layer and the second redistribution pattern.

10. The semiconductor package of claim 9, wherein
    the UBM seed layer comprises titanium, and
    the UBM conductive layer comprises copper.

11. The semiconductor package of claim 1, wherein
    a thickness of the second redistribution pattern ranges from 3 μm to 10 μm, and
    a thickness of the plurality of conductive pillars ranges from 5 μm to 20 μM.

12. A semiconductor package comprising:
    a semiconductor chip including a chip pad;
    a redistribution structure including a redistribution insulation layer on the semiconductor chip and a plurality of first redistribution patterns on a surface of the redistribution insulation layer, the plurality of first redistribution patterns being connected to the chip pad;
    a passivation layer covering the plurality of first redistribution patterns, the passivation layer being on the redistribution structure and including an opening vertically overlapping a portion of each of the plurality of first redistribution patterns, a first surface of the passivation layer facing the redistribution structure and a second surface of the passivation layer being opposite the first surface of the passivation layer;
    an under-bump metal (UBM) pattern on the second surface of the passivation layer and extending into the opening of the passivation layer, the UBM pattern connecting some of the plurality of first redistribution patterns to each other; and a plurality of conductive pillars on the UBM pattern, some of the plurality of conductive pillars being connected to one another through the UBM pattern.

13. The semiconductor package of claim 12, further comprising:

a package connection terminal on the plurality of conductive pillars, the package connection terminal having a thickness ranging from 15 μm to 30 μM.

14. The semiconductor package of claim 13, wherein the plurality of first redistribution patterns comprise a plurality of signal redistribution patterns and a plurality of power/ground redistribution patterns, the plurality of signal redistribution patterns are configured to transfer a data signal or a control signal between the semiconductor chip and the package connection terminal, the plurality of power/ground redistribution patterns are configured to supply power to the semiconductor chip or to ground the semiconductor chip, and the UBM pattern connects at least two of the plurality of signal redistribution patterns to each other and connects at least two of the plurality of power/ground redistribution patterns to each other.

15. The semiconductor package of claim 13, wherein the plurality of first redistribution patterns comprise a plurality of signal redistribution patterns and a plurality of power/ground redistribution patterns, the plurality of signal redistribution patterns are configured to transfer a data signal or a control signal between the semiconductor chip and the package connection terminal, the plurality of power/ground redistribution patterns are configured to supply power to the semiconductor chip or to ground the semiconductor chip, and the UBM pattern is configured to connect some of the plurality of signal redistribution patterns to some of the plurality of power/ground redistribution patterns.

16. A semiconductor device comprising:

a package substrate including a package substrate pattern, a package substrate insulation layer surrounding the package substrate pattern, and a package substrate pad on the package substrate insulation layer, the package substrate pad being connected to the package substrate pattern; and a semiconductor package mounted on the package substrate, the semiconductor package including a semiconductor chip including a chip pad;

a redistribution structure including a redistribution insulation layer on the semiconductor chip and a plurality of first redistribution patterns on a surface of the redistribution insulation layer, the plurality of first redistribution patterns being connected to the chip pad;

a passivation layer covering the plurality of first redistribution patterns, the passivation layer being on the redistribution structure and including an opening vertically overlapping a portion of each of the plurality of first redistribution patterns;

an under-bump metal (UBM) pattern on the passivation layer and extending into the opening of the passivation layer, the UBM pattern connecting some of the plurality of first redistribution patterns to each other;

a plurality of conductive pillars on the UBM pattern, some of the plurality of conductive pillars being connected to one another through the UBM pattern; and a plurality of package connection terminals on the plurality of conductive pillars, the plurality of package connection terminals contacting the package substrate pad of the package substrate, wherein the opening in the passivation layer comprises a first opening and a second opening spaced apart from each other, and a continuous portion of the UBM pattern extends into the first opening of the passivation layer, along a surface of the passivation layer, and into the second opening of the passivation layer.

17. The semiconductor device of claim 16, further comprising:

a second redistribution pattern between the UBM pattern and the plurality of conductive pillars to have a pattern having a same peripheral shape as a peripheral shape of the UBM pattern, wherein some of the plurality of package connection terminals are connected to one another through the UBM pattern and the second redistribution pattern.

18. The semiconductor device of claim 17, wherein the second redistribution pattern comprises:

a second redistribution line pattern extending in a horizontal direction on the UBM pattern; and a second redistribution seed layer between the second redistribution line pattern and the UBM pattern.

19. The semiconductor device of claim 17, wherein the second redistribution pattern is exposed to an outside of the semiconductor device, and in a plan view of the semiconductor package, the UBM pattern and the second redistribution pattern overlap each other in a vertical direction.

20. The semiconductor device of claim 17, wherein the UBM pattern comprises:

a UBM seed layer conformally formed along the plurality of first redistribution patterns and the surface of the passivation layer; and a UBM conductive layer between the UBM seed layer and the second redistribution pattern.

\* \* \* \* \*